(12) United States Patent
Shinomiya

(10) Patent No.: US 6,262,628 B1
(45) Date of Patent: Jul. 17, 2001

(54) DIFFERENTIAL AMPLIFIER CIRCUIT

(75) Inventor: Kohji Shinomiya, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/432,078

(22) Filed: Nov. 2, 1999

(30) Foreign Application Priority Data

Jun. 23, 1999 (JP) .................................................. 11-176753

(51) Int. Cl.⁷ ....................................................... H03F 3/45
(52) U.S. Cl. ............................................. 330/69; 330/252
(58) Field of Search ................................... 330/252, 257, 330/261, 69, 258, 150, 310, 124 R, 295

(56) References Cited

U.S. PATENT DOCUMENTS

| | | | |
|---|---|---|---|
| 4,337,441 | * 6/1982 | Kellogg | 330/261 |
| 4,484,146 | * 11/1984 | Naito | 330/69 |
| 5,305,109 | * 4/1994 | Harford | 348/737 |
| 5,378,885 | * 1/1995 | Jones, Jr. et al. | 235/449 |
| 5,633,765 | * 5/1997 | Lin et al. | 360/46 |
| 5,757,566 | 5/1998 | Ngo et al. | |

FOREIGN PATENT DOCUMENTS

| | | |
|---|---|---|
| 62-6403 | 1/1987 | (JP) . |
| 64-48506 | 2/1989 | (JP) . |
| 6-243405 | 9/1994 | (JP) . |
| 7-287802 | 10/1995 | (JP) . |
| 11-31302 | 2/1999 | (JP) . |

* cited by examiner

Primary Examiner—Robert Pascal
Assistant Examiner—Henry Choe
(74) Attorney, Agent, or Firm—Leydig, Voit & Mayer, Ltd.

(57) ABSTRACT

When a signal source to be amplified has an AC voltage signal superimposed on a DC voltage, instead of providing two coupling capacitors in a differential amplifier, a third differential amplifier is provided for receiving the outputs of a first differential amplifier and a second differential amplifier.

19 Claims, 14 Drawing Sheets

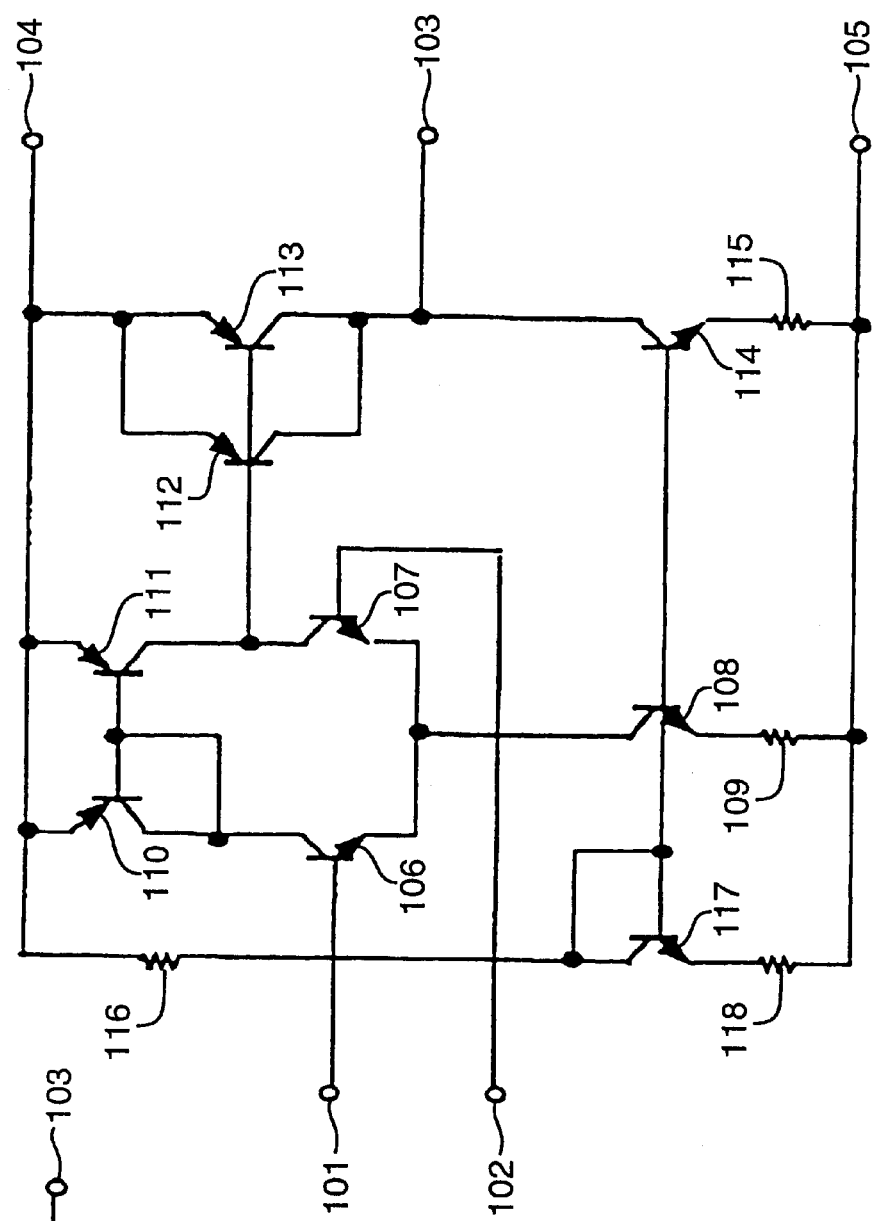
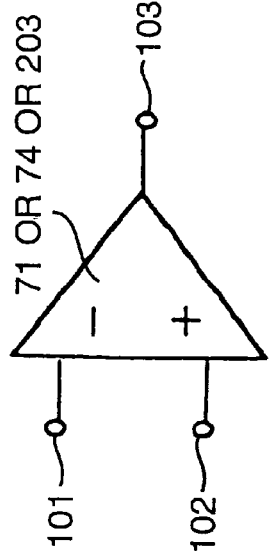
FIG. 6A
FIG. 6B

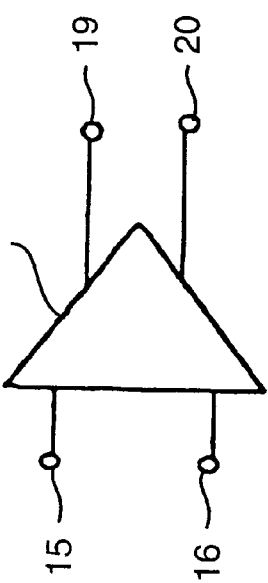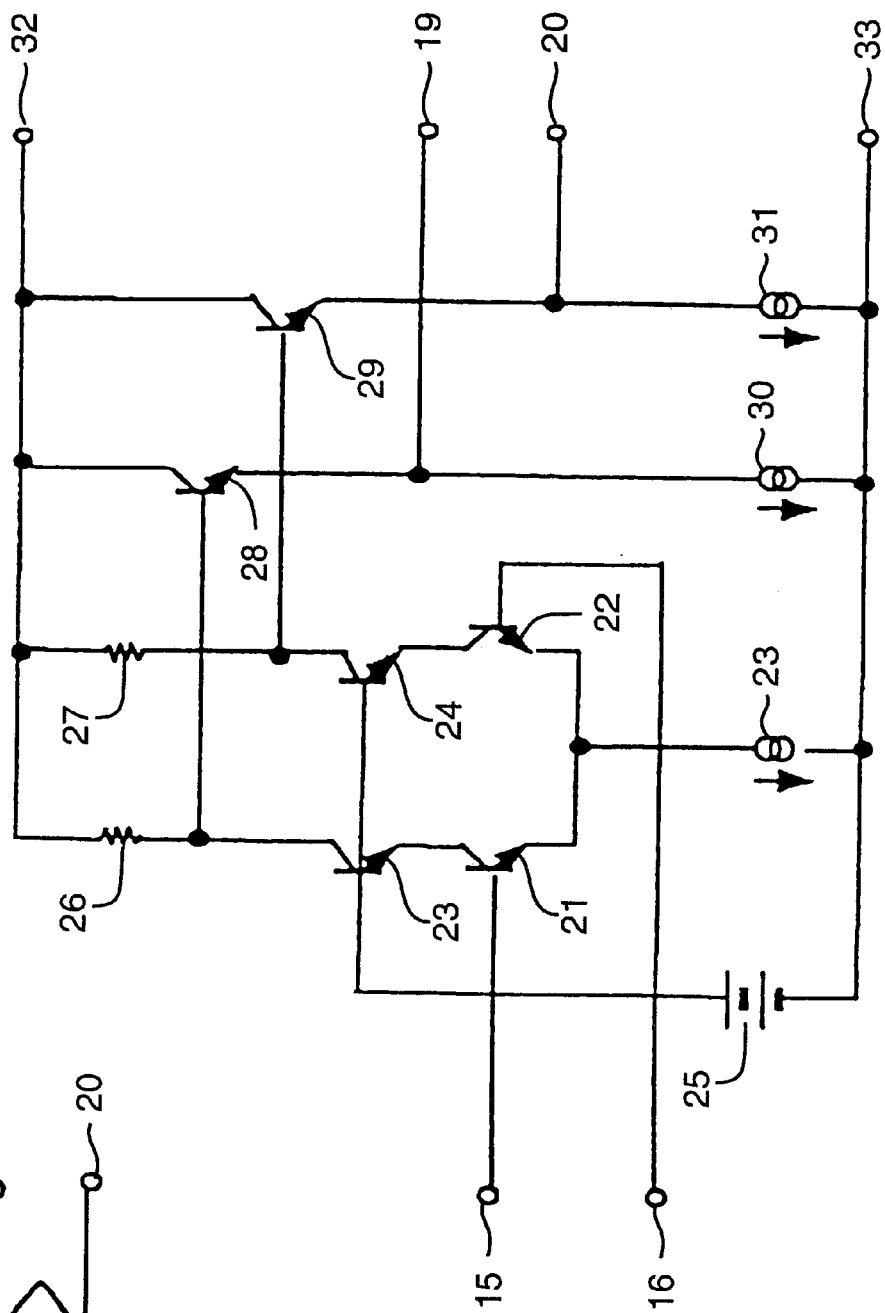
FIG. 14A
FIG. 14B

DIFFERENTIAL AMPLIFIER CIRCUIT

FIELD OF THE INVENTION

The present invention relates to a differential amplifier circuit. More particularly, this invention relates to a differential amplifier circuit for amplifying an AC signal when a signal source to be amplified is a signal source in which an AC voltage signal is superimposed on a DC voltage.

BACKGROUND OF THE INVENTION

FIG. 13 is a circuit diagram showing an example of a conventional differential amplifier. In FIG. 13, reference numeral 1 denotes a signal source in which an AC voltage signal is superimposed on a DC voltage source, and reference numerals 2 and 3 denote transistors constituting an emitter follower type amplifier, respectively. Reference numerals 4 and 5 denote constant current sources for supplying a current to the respective emitters of the transistors 2 and 3. Furthermore, reference numeral 6 denotes a resistor for supplying a current to the respective bases of the transistors 2 and 3, and serves to determine the electric potential of the signal source 1 together with a resistor 7.

According to such a structure, signals converted to have low impedances are obtained from the respective emitters of the transistors 2 and 3. These two signals have an AC voltage signal superimposed on a DC voltage which is obtained by level-shifting a DC voltage part of the signal source 1 by a voltage (Vbe) part between the base and emitter of each of the transistors 2 and 3. The signals obtained from the respective emitters of the transistors 2 and 3 are connected to input terminals 15 and 16 of a differential amplifier 14 through coupling capacitors 8 and 9. Reference numerals 10, 11, 12 and 13 denote resistors for biasing a transistor in the differential amplifier 14, reference numeral 17 denotes a first voltage source, that is, a positive electrode power terminal in this case, and reference numeral 18 denotes a second voltage source, that is, a negative electrode power terminal in this case.

Next, the action and operation of the conventional art will be described.

Although the signal source 1 has been represented by a basic equivalent circuit in which a signal source resistor, an AC voltage signal source and a DC voltage source are connected in series in order to easily understand the description as shown in FIG. 13, a signal is actually taken out by a magnetoresistive head (MRH) or the like in a more complicated equivalent circuit, for example. For this reason, the resistors 6 and 7 are serially connected to the signal source 1 in order to determine the circuit potential of the signal source 1, the other terminal of the resistor 6 is connected to the positive electrode power terminal 17 and the other terminal of the resistor 7 is connected to the negative electrode power terminal 18. The resistor 6 also serves to produce a bias current to be supplied to the respective bases of the transistors 2 and 3.

The collectors of transistors 2 and 3 are connected to the positive electrode power terminal 17 respectively, and emitters are connected to the constant current sources 4 and 5, thereby supplying an emitter current. Thus, two independent emitter follower type amplifiers are formed. The constant current sources 4 and 5 cause currents having almost the same values to flow. Consequently, voltages between the bases and emitters of the transistors 2 and 3 are almost equal to each other. Thus, a signal in which an AC voltage signal is superimposed on a DC voltage can be obtained as a low impedance signal in each of the emitters.

Furthermore, one of the terminals of each of the coupling capacitors 8 and 9 is connected to the emitter of each of the transistors 2 and 3, and the other terminal thereof is connected to each of the input terminals 15 and 16 of the differential amplifier 14 in the subsequent stage. The resistors 10, 11, and 12, 13 for supplying bias voltages are connected to the input terminals 15 and 16 of the differential amplifier 14, respectively. The bias voltages of the input terminals 15 and 16 are set to DC voltages which are almost equal to each other, and act such that the differential amplifier 14 can stably perform an amplifying operation. An output is given as a differential output from the differential amplifier 14 to the terminals 19 and 20.

FIGS. 14A and 14B show examples of the differential amplifier 14. FIG. 14A shows the differential amplifier 14 in FIG. 13, and FIG. 14B shows the structure of the differential amplifier 14 in more detail. In FIG. 14B, reference numerals 21 and 22 denote transistors constituting a differential pair, and have respective emitters connected in common and furthermore connected to a constant current source 23, thereby supplying a bias current. Each of the collectors of the transistors 21 and 22 constituting a differential pair is connected to each of the emitters of the transistors 23 and 24 in order to reduce a time constant of a capacity parasitic to the collector section. The transistors 23 and 24 have bases connected in common and connected to a DC power source 25. A differential current signal obtained on each of the collectors of the transistors 21 and 22 constituting the differential pair passes from each of the emitters of the transistors 23 and 24 through each of the collectors thereof, and is supplied to load resistors 26 and 27 and is then converted into a differential voltage signal. The differential voltage signal is converted to have a low impedance in two emitter follower type amplifiers constituted by transistors 28 and 29 and constant current sources 30 and 31, and a differential output is obtained on each of the output terminals 19 and 20. Reference numeral 32 denotes a positive electrode power terminal, and reference numeral 33 denotes a negative electrode power terminal.

Since the conventional differential amplifier has the above-mentioned structure, AC voltage signals superimposed on two different DC voltages are taken out for the 2-terminal signal source 1 by using the two coupling capacitors 8 and 9, and are superimposed on two independent DC voltages which are newly produced from two sets of resistance dividing circuits 10, 11, and 12, 13 and are almost equal to each other, thereby generating two voltage signals obtained by superposing the AC voltage signals on the DC voltages which are almost equal to each other, and the coupling capacitors 8 and 9 are connected to the two input terminals 15 and 16 of the differential amplifier 14 in the subsequent stage to perform a differential amplification so that two differential outputs are taken out. Therefore, the two coupling capacitors 8 and 9 have been required.

For example, in the case where a signal having a high frequency of 1 MHz or more is to be amplified, two capacitors are built in a semiconductor chip. Since the capacitor is constituted as a semiconductor integrated circuit, the area of 0.57 mm square is required even if it is assumed that the capacitance is 0.001 uF. Therefore, it can easily be understood that an area of 0.81 mm square is required for two capacitors. The area of 0.81 mm square is enormous on the semiconductor chip so that the semiconductor chip becomes very large. Accordingly, the manufacturing cost of the semiconductor integrated circuit is increased. In reality, it is necessary to make a pattern layout for decreasing a loss angle (tan δ) of the capacitor.

Therefore, a chip area which is much greater than 0.81 mm square is disadvantageously required.

SUMMARY OF THE INVENTION

In order to eliminate the above-mentioned drawbacks, it is an object of the present invention to provide a differential amplifier which does not require two coupling capacitors. Thus, a chip area corresponding to two coupling capacitors built in a semiconductor integrated circuit can be reduced, and more particularly, the influence of unnecessary parasitic elements (a capacitance and a series resistance) parasitic to the two built-in coupling capacitors can be eliminated. Therefore, a high frequency characteristic can be improved. Accordingly, when a semiconductor integrated circuit and an application system are constituted, the characteristic can be improved and the manufacturing cost can be reduced.

In the present invention, a differential amplifier comprises a first differential amplifier and a second differential amplifier, having one input terminals to which respective terminals of a signal source are connected, and a third differential amplifier having input terminals to which an output terminal of the first differential amplifier and an output terminal of the second differential amplifier are respectively connected. Therefore, an AC voltage signal is taken out by blocking a DC voltage without requiring the coupling capacitors. Since the coupling capacitors are not required the chip area can be reduced, and also the manufacturing cost can be cut down.

Other objects and features of this invention will become apparent from the following description with reference to the accompanying drawings.

BRIEF DESCRIPTION OF THE DRAWINGS

FIG. 6A shows a circuit diagram of an operational amplifier and FIG. 6B shows a detail circuit diagram of the operational amplifier;

FIGS. 14A and 14B are circuit diagrams showing an example of the specific structure of the differential amplifier.

DESCRIPTION OF THE PREFERRED EMBODIMENTS

A first embodiment of the present invention will be described below with reference to the drawings.

Figure 1:
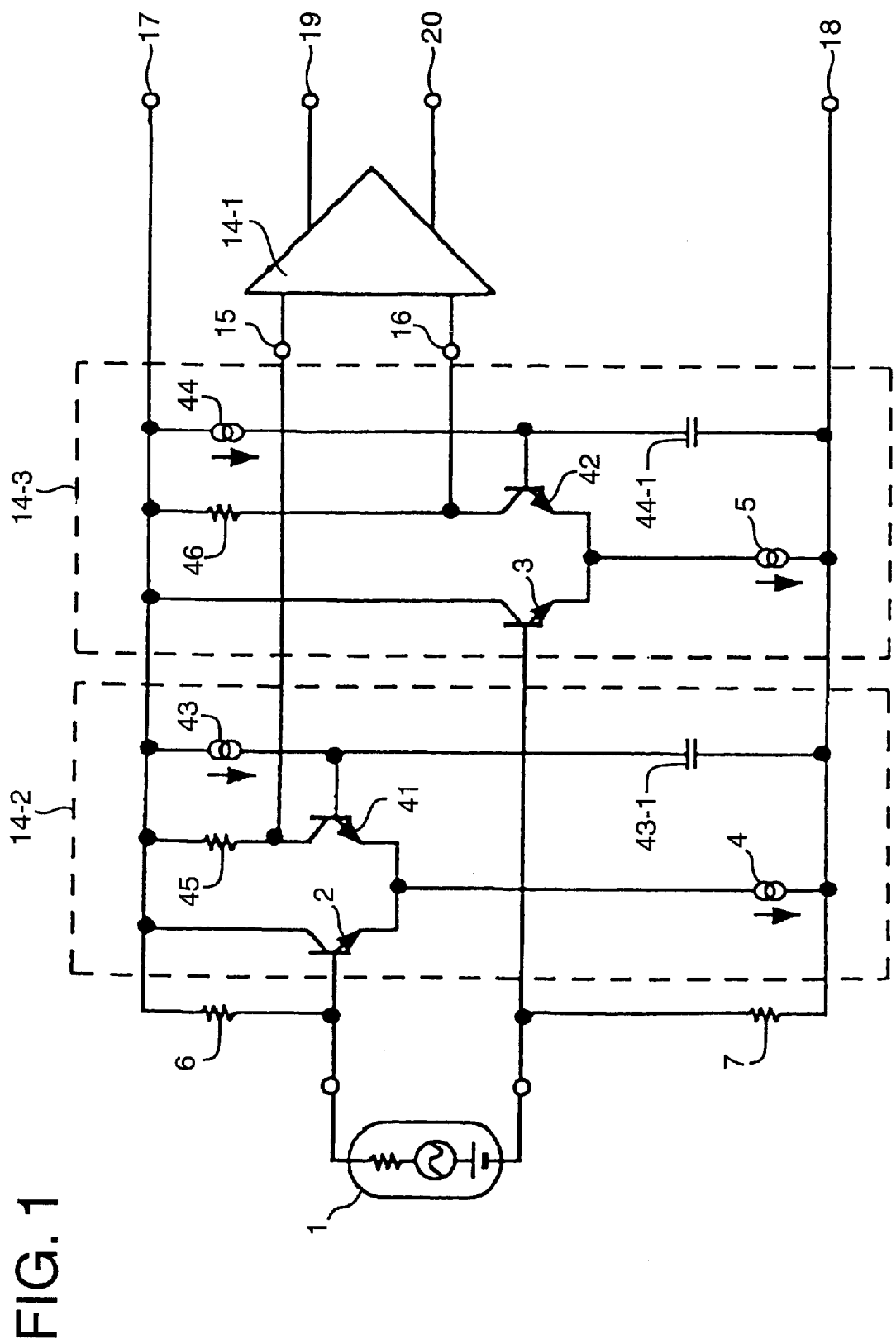
FIG. 1 is a circuit diagram showing a differential amplifier according to a first embodiment of the present invention.

In FIG. 1, reference numeral 1 denotes a signal source in which an AC voltage signal is superimposed on a DC voltage source, reference numerals 2 and 41 denote transistors constituting a differential pair of a first differential amplifier 14-2, and reference numerals 3 and 42 denote transistors constituting a differential pair of a second differential amplifier 14-3. These two differential amplifiers are constituted to have almost the same characteristics. Reference numerals 4 and 5 denote constant current sources for supplying almost the same currents to the differential pair of the first differential amplifier 14-2 and that of the second differential amplifier 14-3, respectively. Reference numeral 6 denotes a resistor for supplying a current to the base of each of the transistors 2 and 3 and for determining the electric potential of the signal source 1 together with a resistor 7. Reference numerals 43 and 43-1 constitute a first current source which is set such that a current having a value almost equal to a mean value of the current flowing to the base of the transistor 2 is caused to flow, thereby supplying the base current of the transistor 41. Reference numerals 44 and 44-1 constitute a second current source which is set such that a current having a value almost equal to the mean value of the current flowing to the base of the transistor 2 is caused to flow, thereby supplying the base current of the transistor 42. Reference numerals 43-1 and 44-1 denote capacitors for storing electric charges to vary the base current depending on a change in a signal. Reference numeral 45 denotes a first load resistor of the transistor 41, and reference numeral 46 denotes a second load resistor of the transistor 42. The resistors 45 and 46 are constituted to have almost the same characteristics. A voltage signal is taken out from a node of the collector of the transistor 41 and the resistor 45, and is connected to one of the input terminals of the third differential amplifier 14-1 through a terminal 15. Similarly, a voltage signal is taken out from a node of the collector of the transistor 42 and the resistor 46, and is connected to the other input terminal of the third differential amplifier 14-1 through a terminal 16. Reference numerals 19 and 20 denote differential output terminals of the third differential amplifier 14-1 from which an amplified AC voltage differential signal can be obtained. Moreover, reference numeral 17 denotes a first voltage source, that is, a positive electrode power terminal in the present embodiment, and reference numeral 18 denotes a second voltage source, that is, a negative electrode power terminal in the present embodiment.

Next, the operation of the first embodiment will be described.

The resistors 6 and 7 are serially connected to the signal source 1 in order to determine the circuit potential of the signal source 1, and the other terminal of the resistor 6 is connected to the positive electrode power terminal 17 and the other terminal of the resistor 7 is connected to the negative electrode power terminal 18. The resistor 6 also serves to produce a bias current to be supplied to the respective bases of the transistors 2 and 3. The transistors 2 and 41, the constant current source 4, the current sources 43 and 43-1, and the resistor 45 constitute the first differential amplifier 14-2, and the transistors 3 and 42, the constant current source 5, the current sources 44 and 44-1 and the resistor 46 constitute the second differential amplifier 14-3. The first differential amplifier 14-2 and the second differential amplifier 14-3 are constituted to have almost the same electrical characteristics. The output terminals of the first differential amplifier 14-2 and the second differential amplifier 14-3 are connected to the input terminals 15 and 16 of the third differential amplifier 14-1 respectively, thereby producing differential outputs on the output terminals 19 and 20.

The transistors 2 and 3 constitute emitter follower type amplifiers (collector ground type amplifiers) respectively, and the AC voltage signals input to respective bases are output from emitters so that AC voltage signals converted to have a low impedance can be obtained. The transistors 41 and 42 constitute base ground type amplifiers (cascade type amplifiers) respectively, and the AC voltage signals input to respective emitters are output from collectors so that AC voltage signals converted from a voltage to a current can be obtained.

These two AC current signals are supplied to the two load resistors 45 and 46 which are connected to the positive electrode source voltage 17 in common and have almost the same resistance values, respectively. Thus, two AC voltage signals converted from a current to a voltage can be obtained.

These AC voltage signals are superimposed on the same voltage. These two AC voltage signals are input to the two input terminals 15 and 16 of the third differential amplifier 14-1, thereby producing differential outputs on the output terminals 19 and 20.

The setting of the current that flows to the respective bases of the transistors 41 and 42 is important. In order to operate the first differential amplifier 14-2 and the second differential amplifier 14-3 as independent differential amplifiers respectively, currents having mean values of the currents flowing to the respective bases of the transistors 2 and 3 are produced and are caused to flow to the respective bases of the transistors 41 and 42. Since it is sufficient that the capacitor 43-1 constituting the first current source and the capacitor 44-1 constituting the second current source store electric charges which can supply a change part of each of the base currents of the transistors 41 and 42, their capacities can have very small values. For example, if it is assumed that a change in a base current of 100 $\mu$A is 10 $\mu$A at 1 MHz, a capacitance of about 3 pF is sufficient. The area occupied by the chip of 3 pF is 0.032 mm square. Since two capacitors are required, the area occupied is 0.045 mm square. This size is much smaller than a chip occupied area of 0.81 mm square in two conventional coupling capacitors. According to the present embodiment, therefore, it is possible to obtain a circuit in which a signal can be sent by direct connection of wirings without passing through two coupling capacitors in a differential amplifier manufactured by a semiconductor integrated circuit. Therefore, it is possible to obtain the effect of considerably improving the degree of freedom of a circuit design. Furthermore, a chip area corresponding to the two coupling capacitors built in the semiconductor integrated circuit can be reduced. As compared with the prior art, particularly, the influence of unnecessary parasitic capacities parasitic to the two built-in coupling capacitors can be eliminated so that a high frequency characteristic can be improved and the manufacturing cost of the semiconductor integrated circuit can be reduced.

The current having a mean value of the current flowing to each of the bases of the transistors 2 and 3 can be produced by various methods. Three basic methods are described below.

As a first method, an interlocking operation is performed with the operating state of the constant current source 4 of the first differential amplifier 14-2 and with that of the constant current source 5 of the second differential amplifier 14-3, respectively. Thus, a bias current or a bias voltage is produced by the respective interlocking operations of the constant current sources. As a second method, the operating state of the transistor 2 of the first differential amplifier 14-2 is detected, and furthermore, the operating state of the transistor 3 of the second differential amplifier 14-3 is detected. Based on the results of the detection of the operating states of the respective transistors, thus, each bias current or bias voltage is produced. As a third method, the output of the first differential amplifier 14-2 is monitored and the output of the second differential amplifier 14-3 is monitored. By detecting the states of the respective outputs, each bias current or bias voltage is produced. These methods will be specifically described in detail in each of the embodiments.

The embodiment shown in FIG. 1 corresponds to an example of the above-mentioned first method.

While a load circuit has been constituted by the load resistor 45 or 46 in FIG. 1, the same effects can be obtained even if the load circuit is constituted by a current mirror circuit, and furthermore, the third differential amplifier 14-1 has a current input differential type.

A second embodiment of the present invention will be described below with reference to the drawings.

Figure 2:
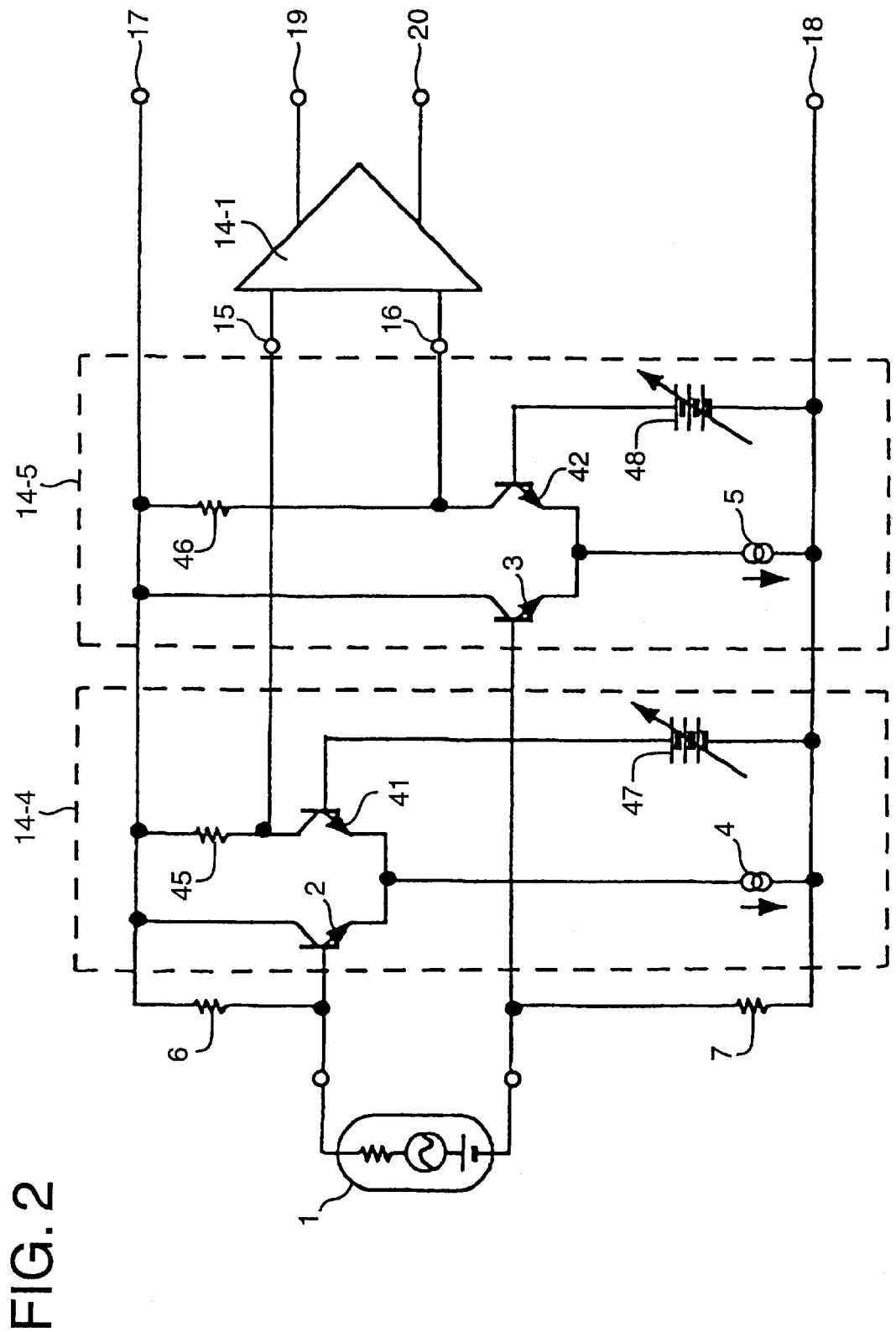
FIG. 2 is a circuit diagram showing a differential amplifier according to a second embodiment of the present invention.

In FIG. 2, reference numeral 1 denotes a signal source in which an AC voltage signal is superimposed on a DC voltage source, reference numerals 2 and 41 denote transistors constituting a differential pair of a first differential amplifier 14-4, and reference numerals 3 and 42 denote transistors constituting a differential pair of a second differential amplifier 14-5. Reference numerals 4 and 5 denote constant current sources for supplying almost the same currents to the differential pair of the first differential amplifier 14-4 and that of the second differential amplifier 14-5, respectively. Reference numeral 6 denotes a resistor for supplying a current to the base of each of the transistors 2 and 3 and for determining the electric potential of the signal source 1 together with a resistor 7. Reference numeral 47 denotes a third voltage source which is set to apply a voltage having a value almost equal to a mean value of the voltage of the base of the transistor 2 and which serves to supply a voltage to the base of the transistor 41. Similarly, reference numeral 48 denotes a fourth voltage source which is set to apply a voltage having a value almost equal to a mean value of the voltage of the base of the transistor 3 and which serves to supply a voltage to the base of the transistor 42. Reference numeral 45 denotes a first load resistor of the transistor 41, and reference numeral 46 denotes a second load resistor of the transistor 42. The resistors 45 and 46 are constituted to have almost the same characteristics. A voltage signal is taken out from a node of the collector of the transistor 41 and the resistor 45, and is connected to one of the input terminals of the third differential amplifier 14-1 through a terminal 15. Similarly, a voltage signal is taken out from a node of the collector of the transistor 42 and the resistor 46, and is connected to the other input terminal of the third differential amplifier 14-1 through a terminal 16. Reference numerals 19 and 20 denote differential output terminals of the third differential amplifier 14-1 from which an amplified AC voltage differential signal can be obtained. Moreover, reference numeral 17 denotes a first voltage source, that is, a positive electrode power terminal in the present embodiment, and reference numeral 18 denotes a second voltage source, that is, a negative electrode power terminal in the present embodiment.

Next, the operation of the second embodiment will be described.

The resistors 6 and 7 are serially connected to the signal source 1 in order to determine the circuit potential of the signal source 1, and the other terminal of the resistor 6 is connected to the positive electrode power terminal 17 and the other terminal of the resistor 7 is connected to the negative electrode power terminal 18. The resistor 6 also serves to produce a bias current to be supplied to the respective bases of the transistors 2 and 3. The transistors 2 and 41, the constant current source 4, the third voltage source 47 and the resistor 45 constitute the first differential amplifier 14-4, and the transistors 3 and 42, the constant current source 5, the fourth voltage source 48 and the resistor 46 constitute the second differential amplifier 14-5. The first differential amplifier 14-4 and the second differential amplifier 14-5 are constituted to have almost the same electrical characteristics. The output terminals of the first differential amplifier 14-4 and the second differential amplifier 14-5 are connected to the input terminals 15 and 16 of the third differential amplifier 14-1 respectively, thereby producing differential outputs on the output terminals 19 and 20.

The transistors 2 and 3 constitute emitter follower type amplifiers (collector ground type amplifiers) respectively, and the AC voltage signals input to respective bases are output from emitters so that AC voltage signals converted to have a low impedance can be obtained.

The transistors 41 and 42 constitute base ground type amplifiers (cascade type amplifiers) respectively, and the AC voltage signals input to respective emitters are output from collectors so that AC voltage signals converted from a voltage to a current can be obtained.

These two AC current signals are supplied to the two load resistors 45 and 46 which are connected to the positive electrode source voltage 17 in common and have almost the same resistance values, respectively. Thus, two AC voltage signals converted from a current to a voltage can be obtained. These AC voltage signals are superimposed on the same voltage. These two AC voltage signals are input to the two input terminals 15 and 16 of the third differential amplifier 14-1, thereby producing differential outputs on the output terminals 19 and 20.

The setting of the voltage that is to be applied to the respective bases of the transistors 41 and 42 is important. In order to operate the first differential amplifier 14-4 and the second differential amplifier 14-5 as independent differential amplifiers respectively, voltages having mean values of the voltages applied to the respective bases of the transistors 2 and 3 are produced and are applied to the respective bases of the transistors 41 and 42. Any of the above-mentioned three methods can be applied. As an example of the simplest methods, the case where the above-mentioned third method is carried out will be described below.

In order to monitor the output of the first differential amplifier 14-4, a probe of an oscilloscope is connected to the input terminal 15 of the third differential amplifier 14-1 to regulate the voltage of the third voltage source 47 while observing the state of a waveform. In the state in which the best waveform having a good linearity is observed, the voltage of the third voltage source 47 is set. Similarly, in order to monitor the output of the second differential amplifier 14-5, the probe of the oscilloscope is connected to the input terminal 16 of the third differential amplifier 14-1 to regulate the voltage of the fourth voltage source 48 while observing the state of a waveform. In the state in which the best waveform having a good linearity is observed, the voltage of the fourth voltage source 48 is set. Thus, a regulating circuit is built in the semiconductor integrated circuit so that the third voltage source 47 is set to apply a voltage having a value almost equal to the mean value of the voltage of the base of the transistor 2. Similarly, the fourth voltage source 48 is set to apply a voltage having a value almost equal to the mean value of the voltage of the base of the transistor 3. The regulating circuit is constituted by various methods, for example, in which a memory circuit and a digital/analog converter are built in or an aluminum wiring of a resistor network is cut by laser beams.

Thus, two coupling capacitors which have conventionally been required are not used in the embodiment shown in FIG. 2. Therefore, the chip occupied area equivalent to 0.81 mm square for the two coupling capacitors in the prior art can be reduced according to this invention. In other words, according to the present invention, it is possible to obtain a circuit in which a signal can be sent by direct connection of wiring without passing through two coupling capacitors in a differential amplifier manufactured by a semiconductor integrated circuit. Therefore, it is possible to obtain the effect of considerably improving the degree of freedom of a circuit design without considering a parasitic capacity, a parasitic series resistance and the like which are obtained by the coupling capacitor. As compared with the prior art, particularly, the influence of unnecessary parasitic capacities parasitic to the two built-in coupling capacitors can be eliminated so that a high frequency characteristic can be improved and the manufacturing cost of the semiconductor integrated circuit can be reduced due to the reduction in the chip area.

A third embodiment of the present invention will be described below with reference to the drawings.

Figure 3:
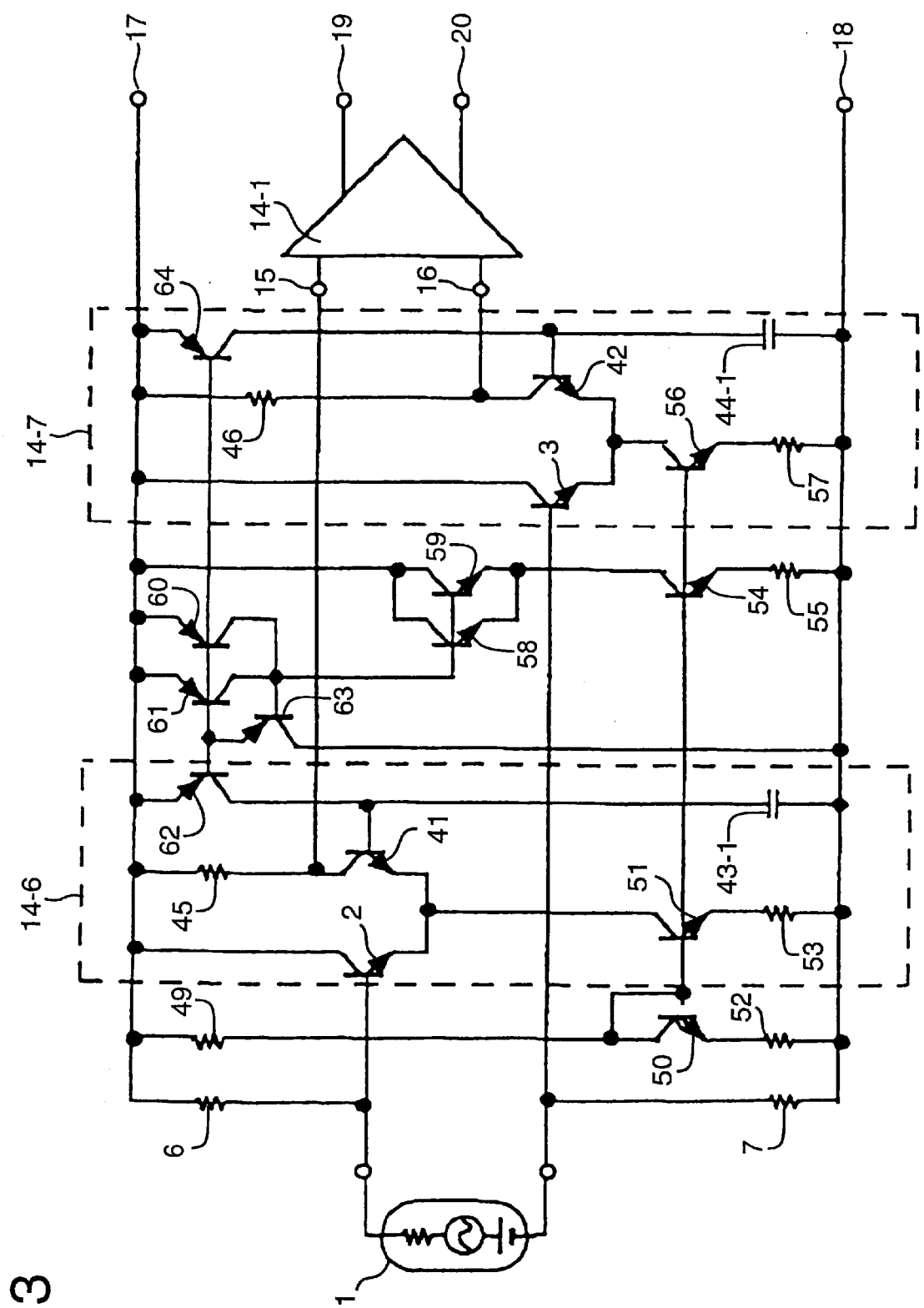
FIG. 3 is a circuit diagram showing a differential amplifier according to a third embodiment of the present invention.

In FIG. 3, reference numeral 1 denotes a signal source in which an AC voltage signal is superimposed on a DC voltage source, reference numerals 2 and 41 denote transistors constituting a differential pair of a first differential amplifier 14-6, and reference numerals 3 and 42 denote transistors constituting a differential pair of a second differential amplifier 14-7. Reference numerals 51 and 53, and 56 and 57 denote transistors and resistors which constitute constant current sources for supplying almost the same currents to the differential pair of the first differential amplifier 14-6 and that of the second differential amplifier 14-7, respectively, and reference numeral 6 denotes a resistor for supplying a current to the base of each of the transistors 2 and 3 and for determining the electric potential of the signal source 1 together with a resistor 7. Reference numerals 62 and 43-1 denote a transistor and a capacitor which constitute a first current source that is set to cause a current having a value almost equal to the mean value of the current flowing to the base of the transistor 2 to flow and that serves to supply the base current of the transistor 41. Similarly, reference numerals 64 and 44-1 denote transistors constituting a second current source which is set to cause a current having a value almost equal to the mean value of the current flowing to the base of the transistor 2 to flow and which serves to supply the base current of the transistor 42. Reference numeral 45 denotes a first load resistor of the transistor 41, and reference numeral 46 denotes a second load resistor of the transistor 42. The resistors 45 and 46 are constituted to have almost the same characteristics. A voltage signal is taken out from a node of the collector of the transistor 41 and the resistor 45, and is connected to one of the input terminals of the third differential amplifier 14-1 through a terminal 15. Similarly, a voltage signal is taken out from a node of the collector of the transistor 42 and the resistor 46, and is connected to the other input terminal of the third differential amplifier 14-1 through a terminal 16. Reference numerals 19 and 20 denote differential output terminals of the third differential amplifier 14-1 from which an amplified AC voltage differential signal can be obtained. Moreover, reference numeral 17 denotes a first voltage source, that is, a positive electrode power terminal in the present embodiment, and reference numeral 18 denotes a second voltage source, that is, a negative electrode power terminal in the present embodiment.

The structure of the first current source will be described below. A resistor 49, a transistor 50 and a resistor 52 produce a reference voltage on the base of the transistor 50. In order to form a constant current source constituted by a transistor 51 and a resistor 53, next, the base of the transistor 50 is connected to that of the transistor 51, thereby constituting a current mirror circuit. Similarly, in order to form a constant current source constituted by a transistor 56 and a resistor 57, the base of the transistor 50 is connected to that of the transistor 56, thereby constituting a current mirror circuit. Similarly, in order to form a constant current source constituted by a transistor 56 and a resistor 57, the base of the transistor 50 is connected to that of the transistor 56, thereby constituting a current mirror circuit. Furthermore, in order to form a constant current source constituted by a transistor 54 and a resistor 55, the base of the transistor 50 is connected to that of the transistor 54, thereby constituting a current mirror circuit. Then, the collector of the transistor 54 is connected to the emitters of transistors 58 and 59 which are connected in parallel, thereby supplying a constant current. Thus, a current having a magnitude which is $1/\beta$ of two transistors (a DC amplification factor of the transistor) is produced on the bases of the transistors 58 and 59, and is supplied to transistors 60, 61 and 63. Consequently, a reference voltage is produced on the bases of the transistors 60 and 61. The bases of the transistors 60 and 61 are connected to those of a transistor 62 constituting a first current source together with the capacitor 43-1 and a transistor 64 constituting a second current source together with the capacitor 44-1, thereby producing a current having a mean value of the current flowing to the base of the transistor 2 and a current having a mean value of the current flowing to the base of the transistor 3. These currents are supplied to the base of the transistor 41 and that of the transistor 42, respectively. Consequently, the first differential amplifier 14-6 and the second differential amplifier 14-7 can stably be operated.

The method for producing currents having mean values of the currents flowing to the bases of the transistors 2 and 3 corresponds to an example of the above-mentioned first method.

Next, the operation of the third embodiment will be described.

The resistors 6 and 7 are serially connected to the signal source 1 in order to determine the circuit potential of the signal source 1, and the other terminal of the resistor 6 is connected to the positive electrode power terminal 17 and the other terminal of the resistor 7 is connected to the negative electrode power terminal 18. The resistor 6 also serves to produce a bias current to be supplied to the respective bases of the transistors 2 and 3. The transistors 2 and 41, the constant current source constituted by the transistor 51 and the resistor 53, the current source constituted by the transistor 62 and the capacitor 43-1, and the resistor 45 constitute the first differential amplifier 14-6, and the transistors 3 and 42, the constant current source consti- tuted by the transistor 46 and the resistor 57, the constant current source constituted by the transistor 64 and the capacitor 44-1 and the resistor 46 constitute the second differential amplifier 14-7. The first differential amplifier 14-6 and the second differential amplifier 14-7 are consti- tuted to have almost the same electrical characteristics. The output terminals of the first differential amplifier 14-6 and the second differential amplifier 14-7 are connected to the input terminals 15 and 16 of the third differential amplifier 14-1 respectively, thereby producing differential outputs on the output terminals 19 and 20.

The transistors 2 and 3 constitute emitter follower type amplifiers (collector ground type amplifiers) respectively, and the AC voltage signals input to respective bases are output from emitters so that AC voltage signals converted to have a low impedance can be obtained.

The transistors 41 and 42 constitute base ground type amplifiers (cascade type amplifiers) respectively, and the AC voltage signals input to respective emitters are output from collectors so that AC voltage signals converted from a voltage to a current can be obtained.

These two AC current signals are supplied to the two load resistors 45 and 46 which are connected to the positive electrode source voltage 17 in common and have almost the same resistance values, respectively. Thus, two AC voltage signals converted from a current to a voltage can be obtained.

These AC voltage signals are superimposed on the same voltage. These two AC voltage signals are input to the two input terminals 15 and 16 of the third differential amplifier 14-1, thereby producing differential outputs on the output terminals 19 and 20.

The setting of the current that flows to the respective bases of the transistors 41 and 42 is important. In order to operate the first differential amplifier 14-6 and the second differen- tial amplifier 14-7 as independent differential amplifiers respectively, currents having mean values of the currents flowing to the respective bases of the transistors 2 and 3 are produced and are caused to flow to the respective bases of the transistors 41 and 42.

In the third embodiment, there has been employed a method for producing a current having a mean value of the current flowing to each of the bases of the transistors 2 and 3 in which the constant current source is constituted by the transistor 51 and the resistor 53, the constant current source is constituted by the transistor 56 and the resistor 57 and a current mirror circuit is constituted by the transistor 54 and the resistor 55, thereby producing the current having a mean value by the respective interlocking operations thereof on the basis of the base potentials of the transistor 50 and the resistor 52.

In the operation of the transistor, the following equation is formed, wherein an emitter current is represented by Ie, a collector current is represented by Ic, a base current is represented by Ib and a current amplification factor of the transistor is represented by $\beta$.

Ie=Ic+Ib and Ic=$\beta$×Ib,

Therefore, Ib=Ie/($\beta$+1).

If $\beta$ is constant, the relationship between Ib and Ie can be set. In the design and manufacture of the semiconductor integrated circuit device, it is necessary to take care that $\beta$ of the transistor has almost the same value. When $\beta$ of the transistor has the same value, the following can be supposed. If it is assumed that the currents flowing to the transistors 51, 54 and 56 are equal based on the characteristic of the current mirror circuit and the first differential amplifier 14-6 and the second differential amplifier 14-7 are set in equilibrium states respectively, all the currents supplied to the emitters of the transistors 2, 41, 58, 59, 3 and 42 are equal to each other. Since the transistors 58 and 59 are connected in parallel, a double current flows to the bases. The double current is supplied to the collectors of the transistors 60 and 61, and a current mirror circuit having a current ratio of 2:1:1 is constituted including the transistors 62, 63 and 64. Accordingly, a current having a magnitude which is $1/(\beta+1)$ of each of the emitter currents of the transistors 2 and 3 flows into each of the collectors of the transistors 62 and 64. Therefore, if this current is supplied to the transistors 41 and 42, the first differential amplifier 14-6 and the second differential amplifier 14-7 can be set into equilibrium states respectively. Thus, a current change part of a signal change part sent to each of the base currents of the transistors 41 and 42 is supplied by the capacitors 43-1 and 44-1. According to such a circuit structure, it is possible to implement a differential amplifier as a whole without using two coupling capacitors.

The transistor 62 and the capacitor 43-1 constitute the first current source, and the transistor 64 and the capacitor 44-1 constitute the second current source. Since it is sufficient for the capacitors 43-1 and 44-1 constituting them to store electric charges which can supply a change in each of the base currents of the transistors 41 and 42, their capacities can have very small values. For example, if it is assumed that a change in a base current of 100 $\mu$A is 10 $\mu$A at 1 MHz, a capacity of about 3 pF is sufficient. The area occupied by a chip of 3 pF is 0.032 mm square. Since two capacitors are required, the area occupied is 0.045 mm square. This size is much smaller than a chip occupied area of 0.81 mm square in two conventional coupling capacitors. According to the third embodiment, therefore, it is possible to obtain a circuit in which a signal can be sent by direct connection of wiring without passing through two coupling capacitors in a differential amplifier manufactured by a semiconductor integrated circuit and to perform a design without considering the parasitic element of the coupling capacitor. Therefore, it is possible to obtain the effect of considerably improving the degree of freedom of a circuit design. Furthermore, a chip area corresponding to the two coupling capacitors built in the semiconductor integrated circuit can be reduced. As compared with the prior art, particularly, the influence of unnecessary parasitic capacities parasitic to the two built-in coupling capacitors can be eliminated so that a high frequency characteristic can be improved and the manufacturing cost of the semiconductor integrated circuit can be cut down due to the reduction in the chip area.

A fourth embodiment of the present invention will be described below with reference to the drawings.

Figure 4:
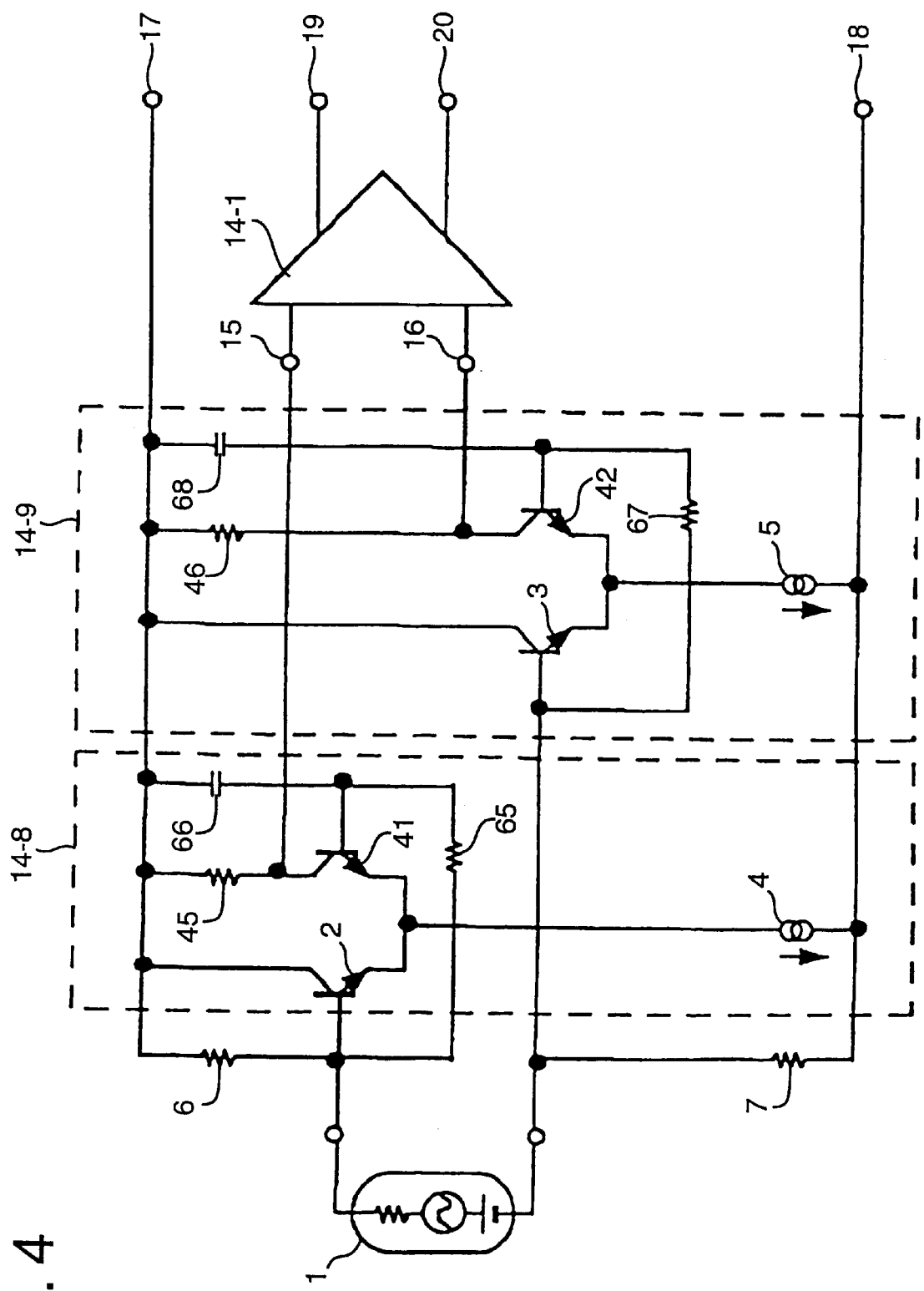
FIG. 4 is a circuit diagram showing a differential amplifier according to a fourth embodiment of the present invention.

In FIG. 4, reference numeral 1 denotes a signal source in which an AC voltage signal is superimposed on a DC voltage source, reference numerals 2 and 41 denote transistors constituting a differential pair of a first differential amplifier 14-8, and reference numerals 3 and 42 denote transistors constituting a differential pair of a second differential amplifier 14-9. Reference numerals 4 and 5 denote constant current sources for supplying almost the same currents to the differential pair of the first differential amplifier 14-8 and that of the second differential amplifier 14-9, respectively. Reference numeral 6 denotes a resistor for supplying a current to the base of each of the transistors 2 and 3 and for determining the electric potential of the signal source 1 together with a resistor 7. Reference numerals 65 and 66 denote a third voltage source formed by an integrating circuit having a resistor and a capacitor which is set to apply a voltage that is almost equal to a mean value of the voltage of the base of the transistor 2 and which serves to supply a voltage to the base of the transistor 41. Similarly, reference numerals 67 and 68 denote a fourth voltage source formed by an integrating circuit having a resistor and a capacitor which is set to apply a voltage that is almost equal to a mean value of the voltage of the base of the transistor 3 and which serves to supply a voltage to the base of the transistor 42. Reference numeral 45 denotes a first load resistor of the transistor 41, and reference numeral 46 denotes a second load resistor of the transistor 42. The resistors 45 and 46 are constituted to have almost the same characteristics. A voltage signal is taken out from a node of the collector of the transistor 41 and the resistor 45, and is connected to one of the input terminals of the third differential amplifier 14-1 through a terminal 15. Similarly, a voltage signal is taken out from a node of the collector of the transistor 42 and the resistor 46, and is connected to the other input terminal of the third differential amplifier 14-1 through a terminal 16. Reference numerals 19 and 20 denote differential output terminals of the third differential amplifier 14-1 from which an amplified AC voltage differential signal can be obtained. Moreover, reference numeral 17 denotes a first voltage source, that is, a positive electrode power terminal in the present embodiment, and reference numeral 18 denotes a second voltage source, that is, a negative electrode power terminal in the present embodiment.

Next, the operation of the fourth embodiment will be described.

The resistors 6 and 7 are serially connected to the signal source 1 in order to determine the circuit potential of the signal source 1, and the other terminal of the resistor 6 is connected to the positive electrode power terminal 17 and the other terminal of the resistor 7 is connected to the negative electrode power terminal 18. The resistor 6 also serves to produce a bias current to be supplied to the respective bases of the transistors 2 and 3. The transistors 2 and 41, the constant current source 4, the third voltage source having the resistor 65 and the capacitor 66 which is formed by the integrating circuit for producing a voltage that is almost equal to the mean value of the voltage of the base of the transistor 2, and the resistor 45 constitute the first differential amplifier 14-8, and the transistors 3 and 42, the constant current source 5, the fourth voltage source having the resistor 67 and the capacitor 68 which is formed by the integrating circuit for producing a voltage that is almost equal to the mean value of the voltage of the base of the transistor 3, and the resistor 46 constitute the second differential amplifier 14-9. The first differential amplifier 14-8 and the second differential amplifier 14-9 are constituted to have almost the same electrical characteristics. The output terminals of the first differential amplifier 14-8 and the second differential amplifier 14-9 are connected to the input terminals 15 and 16 of the third differential amplifier 14-1 respectively, thereby producing differential outputs on the output terminals 19 and 20.

The transistors 2 and 3 constitute emitter follower type amplifiers (collector ground type amplifiers) respectively, and the AC voltage signals input to respective bases are output from emitters so that AC voltage signals converted to have a low impedance can be obtained.

The transistors 41 and 42 constitute base ground type amplifiers (cascade type amplifiers) respectively, and the AC voltage signals input to respective emitters are output from collectors so that AC current signals converted from a voltage to a current can be obtained.

These two AC current signals are supplied to the two load resistors 45 and 46 which are connected to the positive electrode source voltage 17 in common and have almost the same resistance values, respectively. Thus, two AC voltage signals converted from a current to a voltage can be obtained. These AC voltage signals are superimposed on the same voltage. These two AC voltage signals are input to the two input terminals 15 and 16 of the third differential amplifier 14-1, thereby producing differential outputs on the output terminals 19 and 20.

The setting of the voltage that is applied to the respective bases of the transistors 41 and 42 is important. In order to operate the first differential amplifier 14-8 and the second differential amplifier 14-9 as independent differential amplifiers respectively, voltages having mean values of the voltages applied to the respective bases of the transistors 2 and 3 are produced and are directly led from the base of the transistor 2 through the resistor 65 so as to be applied to the respective bases of the transistors 41 and 42. The capacitor 66 is connected to constitute the integrating circuit. Similarly, the voltages are directly led from the base of the transistor 3 through the resistor 67. The capacitor 68 is connected to constitute the integrating circuit. The integrating circuits are connected to the bases of the transistors 41 and 42 respectively, and the base voltage is supplied thereto. More specifically, the voltages having the mean values of the voltages of the respective bases of the transistors 2 and 3 detect the operating states of the transistors 2 and 3 and produce respective bias voltages based on the results of the detection of the operating states of the respective transistors.

While an example in which the third and fourth voltage sources are constituted by the integrating circuits has been described above, the same effects can be obtained even if they are constituted by a separate smoothing circuit, a low-pass filter circuit or the like.

The above-mentioned method corresponds to an example of the second method. In the present embodiment, it is necessary to cause the respective base currents of the transistors 41 and 42 to flow to the resistors 65 and 67. However, there is a problem due to a voltage drop. Therefore, the values of the capacitors 66 and 68 should be increased with those of the resistors 65 and 67 reduced. Accordingly, although this method is preferred for explaining the principle, it has the above-mentioned drawbacks. As compared with the prior art, however, it is possible to obtain a circuit in which a signal can be sent by direction connection of wirings without passing through two coupling capacitors in a differential amplifier manufactured by a semiconductor integrated circuit in the present embodiment. Therefore, it is possible to obtain the effect of considerably improving the degree of freedom of a circuit design without considering the parasitic element of the coupling capacitor. Furthermore, while a chip area corresponding to the two coupling capacitors built in the semiconductor integrated circuit can be reduced, there is a problem in that the areas of two integrating capacitors are required. As compared with the prior art, particularly, the influence of unnecessary parasitic capacities parasitic to the two built-in coupling capacitors can be eliminated. Therefore, a high frequency characteristic can be improved.

A fifth embodiment of the present invention will be described below with reference to the drawings.

Figure 5:
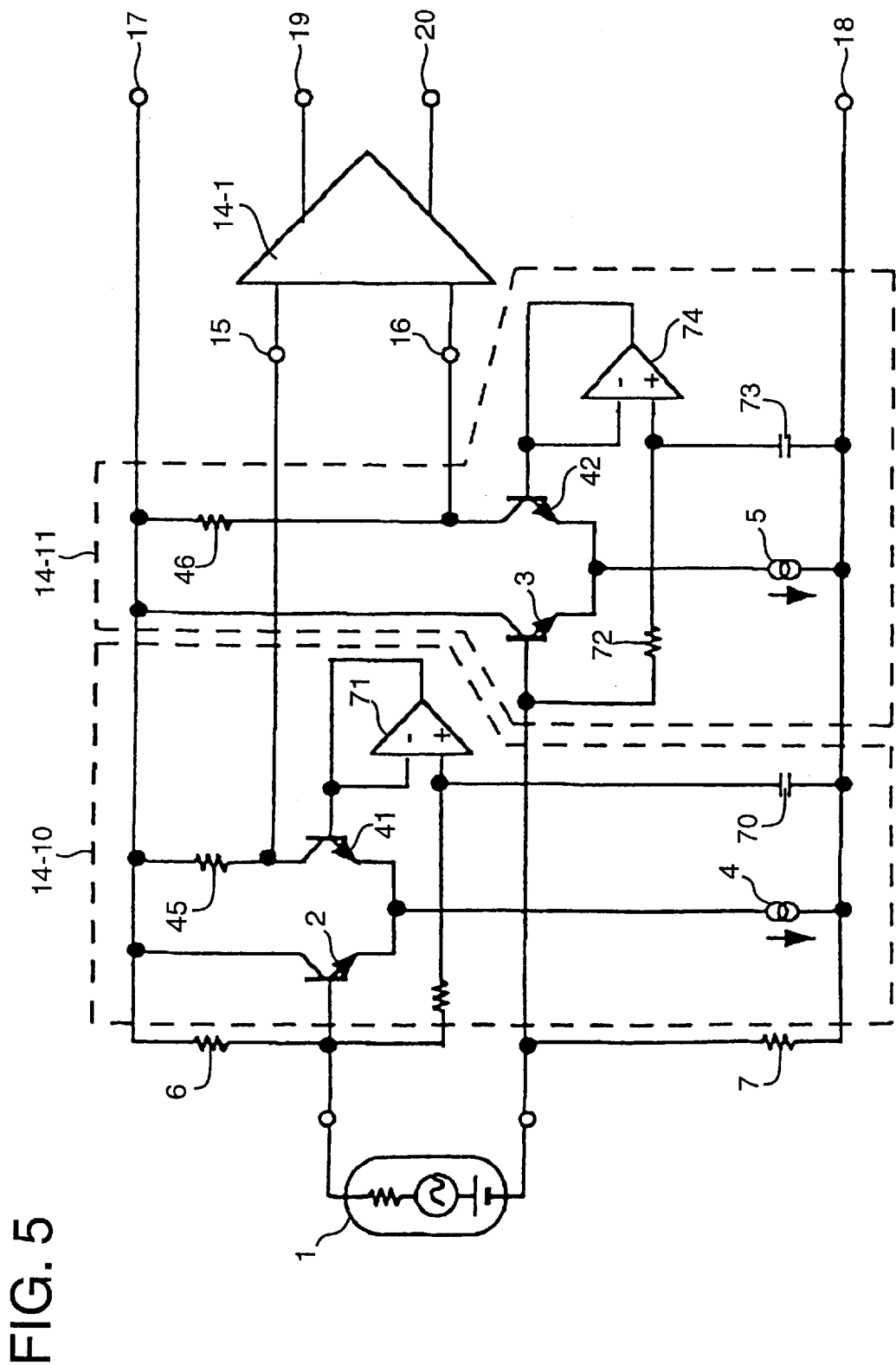
FIG. 5 is a circuit diagram showing a differential amplifier according to a fifth embodiment of the present invention.

In FIG. 5, reference numeral 1 denotes a signal source in which an AC voltage signal is superimposed on a DC voltage source, reference numerals 2 and 41 denote transistors constituting a differential pair of a first differential amplifier 14-10, and reference numerals 3 and 42 denote transistors constituting a differential pair of a second differential amplifier 14-11. Reference numerals 4 and 5 denote constant current sources for supplying almost the same currents to the differential pair of the first differential amplifier 14-10 and that of the second differential amplifier 14-11, respectively. Reference numeral 6 denotes a resistor for supplying a current to the base of each of the transistors 2 and 3 and for determining the electric potential of the signal source 1 together with a resistor 7. Reference numerals 69 and 70 denote a third voltage source which is an integrating circuit having a resistor and a capacitor to apply a voltage that is almost equal to a mean value of the voltage of the base of the transistor 2 and is impedance converted by an operational amplifier 71, the third voltage source serving to supply a voltage to the base of the transistor 41. Similarly, reference numerals 72 and 73 denote a fourth voltage source which is an integrating circuit having a resistor and a capacitor to apply a voltage that is almost equal to a mean value of the voltage of the base of the transistor 3 and is impedance converted by an operational amplifier 74, the fourth voltage source serving to supply a voltage to the base of the transistor 42. Reference numeral 45 denotes a first load resistor of the transistor 41, and reference numeral 46 denotes a second load resistor of the transistor 42. The resistors 45 and 46 are constituted to have almost the same characteristics. A voltage signal is taken out from a node of the collector of the transistor 41 and the resistor 45, and is connected to one of the input terminals of the third differential amplifier 14-1 through a terminal 15. Similarly, a voltage signal is taken out from a node of the collector of the transistor 42 and the resistor 46, and is connected to the other input terminal of the third differential amplifier 14-1 through a terminal 16. Reference numerals 19 and 20 denote differential output terminals of the third differential amplifier 14-1 from which an amplified AC voltage differential signal can be obtained. Moreover, reference numeral 17 denotes a first voltage source, that is, a positive electrode power terminal in the present embodiment, and reference numeral 18 denotes a second voltage source, that is, a negative electrode power terminal in the present embodiment.

Examples of the specific structures of the operational amplifiers 71 and 74 are shown in FIGS. 6A and 6B. FIG. 6A illustrates the operational amplifier 71 or 74 in FIGS. 5, 7, 8 and 10 or 203 of FIG. 12. FIG. 6B illustrates an example in which the operational amplifier is constituted by a specific circuit.

Reference numeral 101 denotes an inverting input terminal, reference numeral 102 denotes a non-inverting input terminal, reference numeral 103 denotes an output terminal, reference numeral 104 denotes a positive electrode power terminal, and reference numeral 105 denotes a negative electrode power terminal. In the example of the operational amplifier, as an internal circuit, reference numerals 106 and 107 denote transistors constituting a differential pair, reference numerals 110 and 111 denote transistors constituting an active load, reference numerals 108 and 109 denote a transistor and a resistor which constitute a constant current source, reference numerals 112 and 113 denote output transistors, reference numerals 114 and 115 denote a transistor and a resistor which constitute a constant current source, resistors 116 and 118 and a transistor 117 produce a reference voltage on a base and are connected to the bases of the transistors 108 and 114, thereby taking out an output on the output terminal 103.

Next, the operation of the fifth embodiment will be described.

The resistors 6 and 7 are serially connected to the signal source 1 in order to determine the circuit potential of the signal source 1, and the other terminal of the resistor 6 is connected to the positive electrode power terminal 17 and the other terminal of the resistor 7 is connected to the negative electrode power terminal 18. The resistor 6 also serves to produce a bias current to be supplied to the respective bases of the transistors 2 and 3. The transistors 2 and 41, the constant current source 4, the third voltage source having the resistor 69 and the capacitor 70 which form the integrating circuit for producing a voltage that is almost equal to the mean value of the voltage of the base of the transistor 2 and which is impedance converted by the operational amplifier 71, and the resistor 45 constitute the first differential amplifier 14-10, and the transistors 3 and 42, the constant current source 5, the fourth voltage source having the resistor 72 and the capacitor 73 which form the integrating circuit for producing a voltage that is almost equal to the mean value of the voltage of the base of the transistor 3 and which is impedance converted by the operational amplifier 74, and the resistor 46 constitute the second differential amplifier 14-11. The first differential amplifier 14-10 and the second differential amplifier 14-11 are constituted to have almost the same electrical characteristics. The output terminals of the first differential amplifier 14-10 and the second differential amplifier 14-11 are connected to the input terminals 15 and 16 of the third differential amplifier 14-1 respectively, thereby producing differential outputs on the output terminals 19 and 20.

The transistors 2 and 3 constitute emitter follower type amplifiers (collector ground type amplifiers) respectively, and the AC voltage signals input to respective bases are output from emitters so that AC voltage signals converted to have a low impedance can be obtained.

The transistors 41 and 42 constitute base ground type amplifiers (cascade type amplifiers) respectively, and the AC voltage signals input to respective emitters are output from collectors so that AC current signals converted from a voltage to a current can be obtained.

These two AC current signals are supplied to the two load resistors 45 and 46 which are connected to the positive electrode source voltage 17 in common and have almost the same resistance values, respectively. Thus, two AC voltage signals converted from a current to a voltage can be obtained. These AC voltage signals are superimposed on the same voltage. These two AC voltage signals are input to the two input terminals 15 and 16 of the third differential amplifier 14-1, thereby producing differential outputs on the output terminals 19 and 20.

The setting of the voltage that is applied to the respective bases of the transistors 41 and 42 is important. In order to operate the first differential amplifier 14-10 and the second differential amplifier 14-11 as independent differential amplifiers respectively, voltages having mean values of the voltages applied to the respective bases of the transistors 2 and 3 are produced and are directly led from the base of the transistor 2 through the resistor 69 so as to be applied to the respective bases of the transistors 41 and 42. The capacitor 70 is connected to constitute the integrating circuit, and a voltage is obtained by impedance conversion by the operational amplifier 71. Similarly, the voltages are directly led from the base of the transistor 3 through the resistor 72. The capacitor 73 is connected to constitute the integrating circuit and a voltage impedance converted by the operational amplifier 74 is obtained. The integrating circuits are connected to the bases of the transistors 41 and 42 respectively, and the base voltage is supplied thereto. More specifically, the voltages having mean values of the voltages of the respective bases of the transistors 2 and 3 are obtained by a method for detecting the respective base voltages to perform the operations of the transistors 2 and 3. This method is an example of the above-mentioned second method.

According to the present invention, a voltage follower circuit is constituted by the operational amplifiers 71 and 74 to perform the impedance conversion as described above. As compared with FIG. 4 according to the fourth embodiment, therefore, a voltage drop can be more reduced even if the values of the resistors 69 and 72 constituting the integrating circuit are more increased. Consequently, the capacitances of the integrating capacitors 70 and 73 can be reduced. For example, if it is assumed that the input currents of the operational amplifiers 71 and 74 is 1 nA, the values of the resistors 69 and 72 are set to 1 MΩ with a voltage drop of 1 mV and it is sufficient that the capacitances of the integrating capacitors 70 and 73 for performing a differential amplification of 1 MHz or more are 1.6 pF and therefore 3.2 pF for the two capacitors. A chip occupied area is 0.034 mm square, and the chip occupied areas of the operational amplifiers 71 and 74 are 0.02 mm square for the two capacitors in FIGS. 6A and 6B. Therefore, the total chip occupied area is 0.039 mm square. This chip occupied area is much smaller than a chip occupied area of 0.81 mm for the two conventional coupling capacitors. According to the present embodiment, therefore, it is possible to obtain a circuit in which a signal can be sent by direct connection of wiring without passing through two coupling capacitors in a differential amplifier manufactured by a semiconductor integrated circuit. Therefore, it is possible to obtain the effect of considerably improving the degree of freedom of a circuit design without considering the parasitic element of the coupling capacitor. Furthermore, a chip area corresponding to the two coupling capacitors built in the semiconductor integrated circuit can be reduced. As compared with the prior art, particularly, the influence of unnecessary parasitic capacities parasitic to the two built-in coupling capacitors can be eliminated. Therefore, a high frequency characteristic can be improved. In addition, the manufacturing cost of the semiconductor integrated circuit can be cut down due to the reduction in the chip area.

A sixth embodiment of the present invention will be described below with reference to the drawings.

Figure 7:
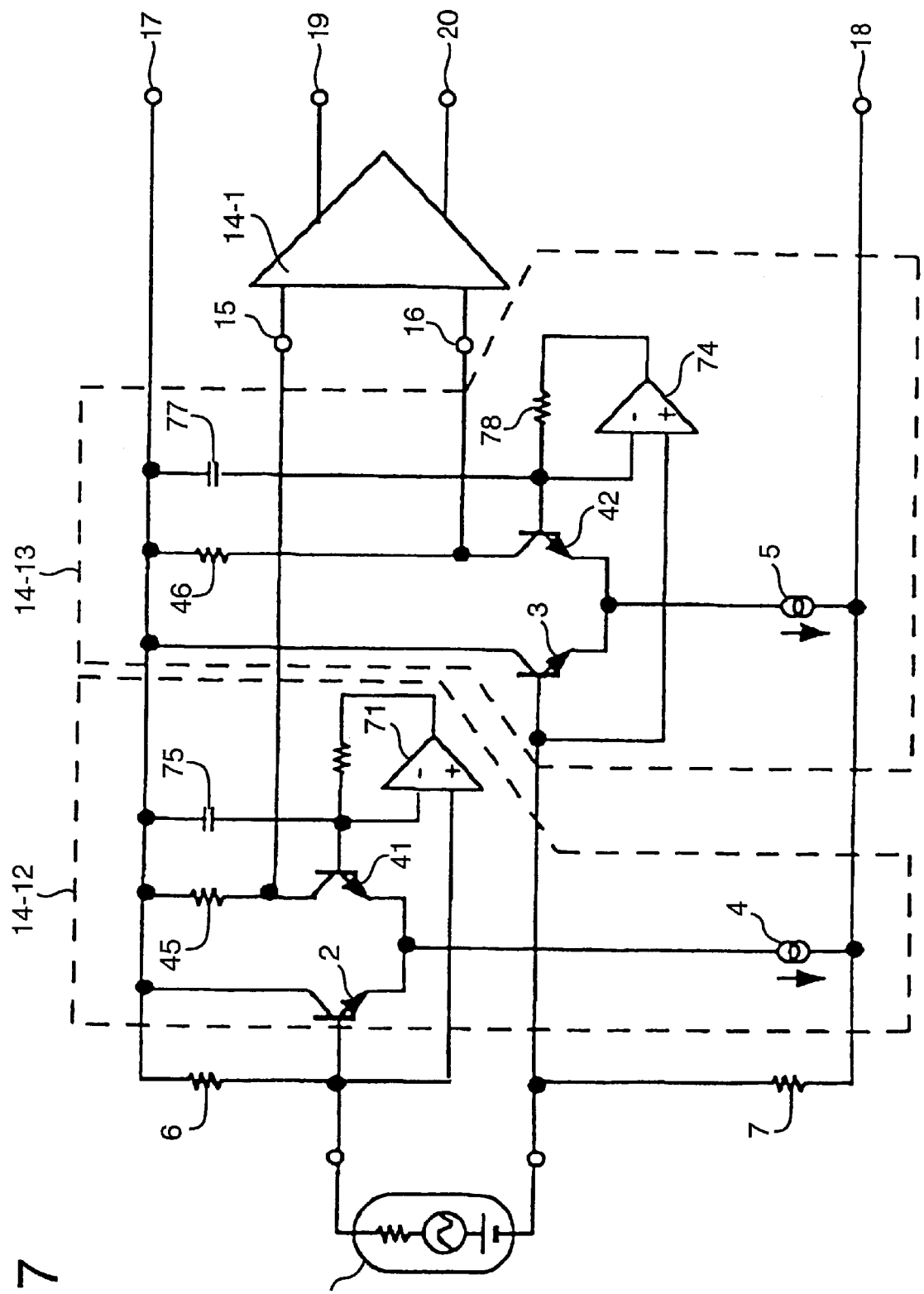
FIG. 7 is a circuit diagram showing a differential amplifier according to a sixth embodiment of the present invention.

In FIG. 7, reference numeral 1 denotes a signal source in which an AC voltage signal is superimposed on a DC voltage source, reference numerals 2 and 41 denote transistors constituting a differential pair of a first differential amplifier 14-12, and reference numerals 3 and 42 denote transistors constituting a differential pair of a second differential amplifier 14-13. Reference numerals 4 and 5 denote constant current sources for supplying almost the same currents to the differential pair of the first differential amplifier 14-12 and that of the second differential amplifier 14-13, respectively. Reference numeral 6 denotes a resistor for supplying a current to the base of each of the transistors 2 and 3 and for determining the electric potential of the signal source 1 together with a resistor 7. A third voltage source is an integrating circuit having a capacitor 75 and a resistor 76 which is impedance converted by an operational amplifier 71 and is set to supply a voltage that is almost equal to a mean value of the voltage of the base of the transistor 2, and serves to supply the voltage to the base of the transistor 41. Similarly, a fourth voltage source is an integrating circuit having a capacitor 77 and a resistor 78 which is impedance converted by an operational amplifier 74 and is set to supply a voltage that is almost equal to a mean value of the voltage of the base of the transistor 3, and serves to supply the voltage to the base of the transistor 42. Reference numeral 45 denotes a first load resistor of the transistor 41, and reference numeral 46 denotes a second load resistor of the transistor 42. The resistors 45 and 46 are constituted to have almost the same characteristics. A voltage signal is taken out from a node of the collector of the transistor 41 and the resistor 45, and is connected to one of the input terminals of the third differential amplifier 14-1 through a terminal 15. Similarly, a voltage signal is taken out from a node of the collector of the transistor 42 and the resistor 46, and is connected to the other input terminal of the third differential amplifier 14-1 through a terminal 16. Reference numerals 19 and 20 denote differential output terminals of the third differential amplifier 14-1 from which an amplified AC voltage differential signal can be obtained. Moreover, reference numeral 17 denotes a first voltage source, that is, a positive electrode power terminal in the present embodiment, and reference numeral 18 denotes a second voltage source, that is, a negative electrode power terminal in the present embodiment.

Examples of the specific structures of the operational amplifiers 71 and 72 are described above in connection with FIGS. 6A and 6B.

Next, the operation of the sixth embodiment will be described.

The resistors 6 and 7 are serially connected to the signal source 1 in order to determine the circuit potential of the signal source 1, and the other terminal of the resistor 6 is connected to the positive electrode power terminal 17 and the other terminal of the resistor 7 is connected to the negative electrode power terminal 18. The resistor 6 also serves to produce a bias current to be supplied to the respective bases of the transistors 2 and 3. The transistors 2 and 41, the constant current source 4, the third voltage source which connects the non-inverting input terminal of the operational amplifier 71 to the base of the transistor 2 to perform impedance conversion and integration by the resistor 76 and the capacitor 75, thereby producing a voltage that is almost equal to the mean value of the voltage of the base of the transistor 2, and the resistor 45 constitute the first differential amplifier 14-12, and the transistors 3 and 42, the constant current source 5, the fourth voltage source which connects the non-inverting input terminal of the operational amplifier 74 to the base of the transistor 3 to perform impedance conversion and integration by the resistor 78 and the capacitor 77, thereby producing a voltage that is almost equal to the mean value of the voltage, of the base of the transistor 3, and the resistor 46 constitute the second differential amplifier 14-13. The first differential amplifier 14-12 and the second differential amplifier 14-13 are constituted to have almost the same electrical characteristics. The output terminals of the first differential amplifier 14-12 and the second differential amplifier 14-13 are connected to the input terminals 15 and 16 of the third differential amplifier 14-1 respectively, thereby producing differential outputs on the output terminals 19 and 20.

The transistors 2 and 3 constitute emitter follower type amplifiers (collector ground type amplifiers) respectively, and the AC voltage signals input to respective bases are output from emitters so that AC voltage signals converted to have a low impedance can be obtained.

The transistors 41 and 42 constitute base ground type amplifiers (cascade type amplifiers) respectively, and the AC voltage signals input to respective emitters are output from collectors so that AC current signals converted from a voltage to a current can be obtained.

These two AC current signals are supplied to the two load resistors 45 and 46 which are connected to the positive electrode source voltage 17 in common and have almost the same resistance values, respectively. Thus, two AC voltage signals converted from a current to a voltage can be obtained. These AC voltage signals are superimposed on the same voltage. These two AC voltage signals are input to the two input terminals 15 and 16 of the third differential amplifier 14-1, thereby producing differential outputs on the output terminals 19 and 20.

The setting of the voltage that is applied to the respective bases of the transistors 41 and 42 is important. In order to operate the first differential amplifier 14-12 and the second differential amplifier 14-13 as independent differential amplifiers respectively, voltages having mean values of the voltages applied to the respective bases of the transistors 2 and 3 are produced. In order to apply the voltages to the respective bases of the transistors 41 and 42, the non-inverting input terminal of the operational amplifier 71 is connected to the base of the transistor 2 to perform impedance conversion and integration by the resistor 76 and the capacitor 75, thereby producing a mean voltage to be supplied to the base of the transistor 41. Similarly, the non-inverting input terminal of the operational amplifier 74 is connected to the base of the transistor 3 to perform impedance conversion and integration by the resistor 78 and the capacitor 77, thereby producing a mean voltage to be supplied to the base of the transistor 41. More specifically, the value having the mean value of the voltage of each of the bases of the transistors 2 and 3 is produced by detecting each of the base voltages of the transistors 2 and 3. This method is an example of the above-mentioned second method.

According to the present invention, the operational amplifiers 71 and 74 constitute a resistor (76, 78) feedback type voltage follower circuit to perform the impedance conversion as described above. As compared with FIG. 4 according to the fourth embodiment, therefore, the values of the resistors 76 and 78 constituting the integrating circuit can freely be set. Therefore, the capacitances of the integrating capacitors 75 and 77 can be reduced. For example, in the case where the values of the integrating resistors (feedback resistors) 76 and 78 are set to 100 kΩ respectively and a differential amplification of 1 MHz or more is to be performed, it is sufficient that the capacitances of the integrating capacitors 75 and 77 are 16 pF and therefore, 32 pF for the two capacitors. A chip occupied area is 0.1 mm square, and the chip occupied areas of the operational amplifiers 71 and 74 are 0.02 mm square for the two capacitors in FIGS. 6A and 6B. Therefore, the total chip occupied area is 0.1 mm square. This chip occupied area is much smaller than a chip occupied area of 0.81 mm for the two conventional coupling capacitors. According to the present embodiment, therefore, it is possible to obtain a circuit in which a signal can be sent by direct connection of wiring without passing through two coupling capacitors in a differential amplifier manufactured by a semiconductor integrated circuit. Therefore, it is possible to obtain the effect of considerably improving the degree of freedom of a circuit design without considering the parasitic element of the coupling capacitor. Furthermore, a chip area corresponding to the two coupling capacitors built in the semiconductor integrated circuit can be reduced and, particularly, the influence of unnecessary parasitic capacities parasitic to the two built-in coupling capacitors can be eliminated as compared with the prior art. Therefore, a high frequency characteristic can be improved. In addition, the manufacturing cost of the semiconductor integrated circuit can be cut down due to the reduction in the chip area.

A seventh embodiment of the present invention will be described below with reference to the drawings.

Figure 8:
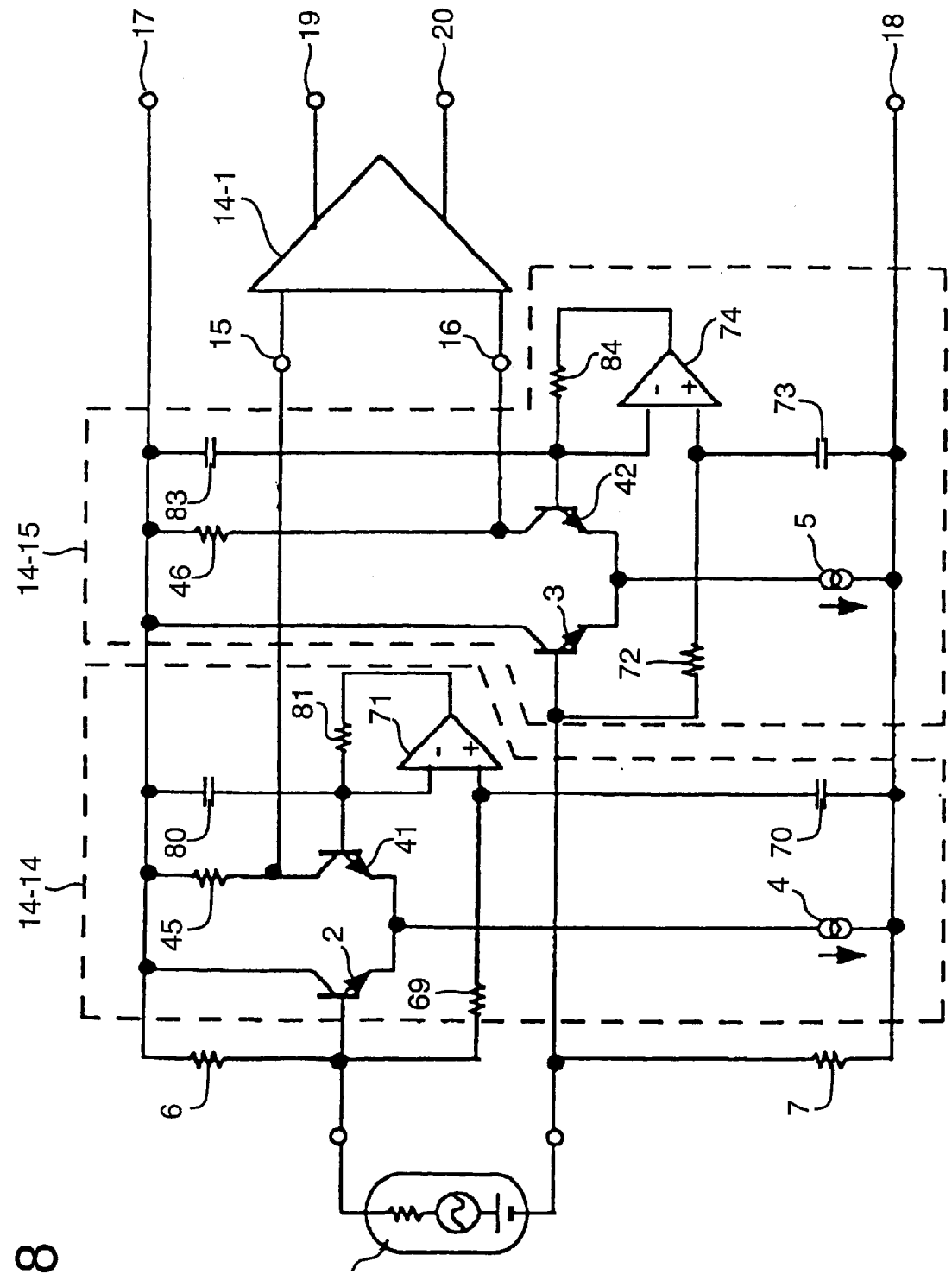
FIG. 8 is a circuit diagram showing a differential amplifier according to a seventh embodiment of the present invention.

In FIG. 8, reference numeral 1 denotes a signal source in which an AC voltage signal is superimposed on a DC voltage source, reference numerals 2 and 41 denote transistors constituting a differential pair of a first differential amplifier 14-14, and reference numerals 3 and 42 denote transistors constituting a differential pair of a second differential amplifier 14-15. Reference numerals 4 and 5 denote constant current sources for supplying almost the same currents to the differential pair of the first differential amplifier 14-14 and that of the second differential amplifier 14-15, respectively. Reference numeral 6 denotes a resistor for supplying a current to the base of each of the transistors 2 and 3 and for determining the electric potential of the signal source 1 together with a resistor 7. A non-inverting input terminal of an operational amplifier 71 is connected to a resistor 69 and an integrating capacitor 70 respectively, and the other terminal of the resistor 69 is connected to the base of the transistor 2. An inverting input terminal of the operational amplifier 71 is connected to the base of a transistor 41, an integrating capacitor 80 and a resistor 81 respectively, and the other terminal of the resistor 81 is connected to the output terminal of the operational amplifier 71. Similarly, a non-inverting input terminal of an operational amplifier 74 is connected to a resistor 72 and an integrating capacitor 73 respectively, and the other terminal of the resistor 72 is connected to the base of the transistor 3. An inverting input terminal of the operational amplifier 74 is connected to the base of a transistor 42, an integrating capacitor 83 and a resistor 84 respectively, and the other terminal of the resistor 84 is connected to the output terminal of the operational amplifier 74. More specifically, both the fifth embodiment and the sixth embodiment are introduced to have a circuit structure. The collector of the transistor 41 is connected to the resistor 45 to take out a voltage signal from a node thereof, and is connected to one of the input terminals of the third differential amplifier 14-1 through a terminal 15. Similarly, the collector of the transistor 42 is connected to the resistor 46 to take out a voltage signal from a node thereof, and is connected to the other input terminal of the third differential amplifier 14-1 through a terminal 16. Reference numerals 19 and 20 denote differential output terminals of the third differential amplifier 14-1 from which an amplified AC voltage differential signal can be obtained. Moreover, reference numeral 17 denotes a first voltage source, that is, a positive electrode power terminal in the present embodiment, and reference numeral 18 denotes a second voltage source, that is, a negative electrode power terminal in the present embodiment.

Examples of the specific structures of the operational amplifiers 71 and 72 have been explained in connection to FIGS. 6A and 6B.

Next, the operation of the seventh embodiment will be described.

The resistors 6 and 7 are serially connected to the signal source 1 in order to determine the circuit potential of the signal source 1, and the other terminal of the resistor 6 is connected to the positive electrode power terminal 17 and the other terminal of the resistor 7 is connected to the negative electrode power terminal 18. The resistor 6 also serves to produce a bias current to be supplied to the respective bases of the transistors 2 and 3. The respective base voltages of the transistors 2 and 3 are detected to produce the third voltage source and the fourth voltage source. The present embodiment is obtained by the introduction of both the fifth and sixth embodiments. This method is an example of the above-mentioned second method.

According to the present embodiment, a resistor feedback type voltage follower circuit is constituted by the operational amplifiers 71 and 74 to perform the impedance conversion as described above. Therefore, a voltage drop can be more reduced even if the values of the resistors 69 and 72 constituting the integrating circuit are more increased. Consequently, the capacitances of the integrating capacitors 70 and 73 can be reduced. For example, if it is assumed that the input currents of the operational amplifiers 71 and 74 are 1 nA, the values of the resistors 69 and 72 are set to 1 MΩ with a voltage drop of 1 mV respectively, and it is sufficient that the capacitances of the integrating capacitors 70 and 73 for performing a differential amplification of 1 MHz or more are 1.6 pF and therefore, 3.2 pF for the two capacitors. A chip occupied area is 0.034 mm square, and the chip occupied areas of the operational amplifiers 71 and 74 are 0.02 mm square for the two capacitors in FIGS. 6A and 6B. Furthermore, the values of the resistors 81 and 84 constituting the integrating circuit can freely be set. Therefore, the capacitances of the integrating capacitors 80 and 83 can be reduced. For example, if the values of the integrating resistors (feedback resistors) 81 and 84 are set to 100 kΩ respectively and a differential amplification of 1 MHz or more is to be performed, it is sufficient that the capacitances of the integrating capacitors 80 and 83 are 16 pF respectively and are 32 pF for the two capacitors. The chip occupied area is 0.1 mm square. Therefore, the total chip occupied area is 0.14 mm square. This chip occupied area is much smaller than a chip occupied area of 0.81 mm for the two conventional coupling capacitors. According to the present embodiment, therefore, it is possible to obtain a circuit in which a signal can be sent by direct connection of wiring without passing through two coupling capacitors in a differential amplifier manufactured by a semiconductor integrated circuit. Therefore, it is possible to obtain the effect of considerably improving the degree of freedom of a circuit design without considering the parasitic element of the coupling capacitor. Furthermore, a chip area corresponding to the two coupling capacitors built in the semiconductor integrated circuit can be reduced. As compared with the prior art, particularly, the influence of unnecessary parasitic capacities parasitic to the two built-in coupling capacitors can be eliminated. Therefore, a high frequency characteristic can be improved. In addition, the manufacturing cost of the semiconductor integrated circuit can be cut down due to the reduction in the chip area.

An eighth embodiment of the present invention will be described below with reference to the drawings.

Figure 9:
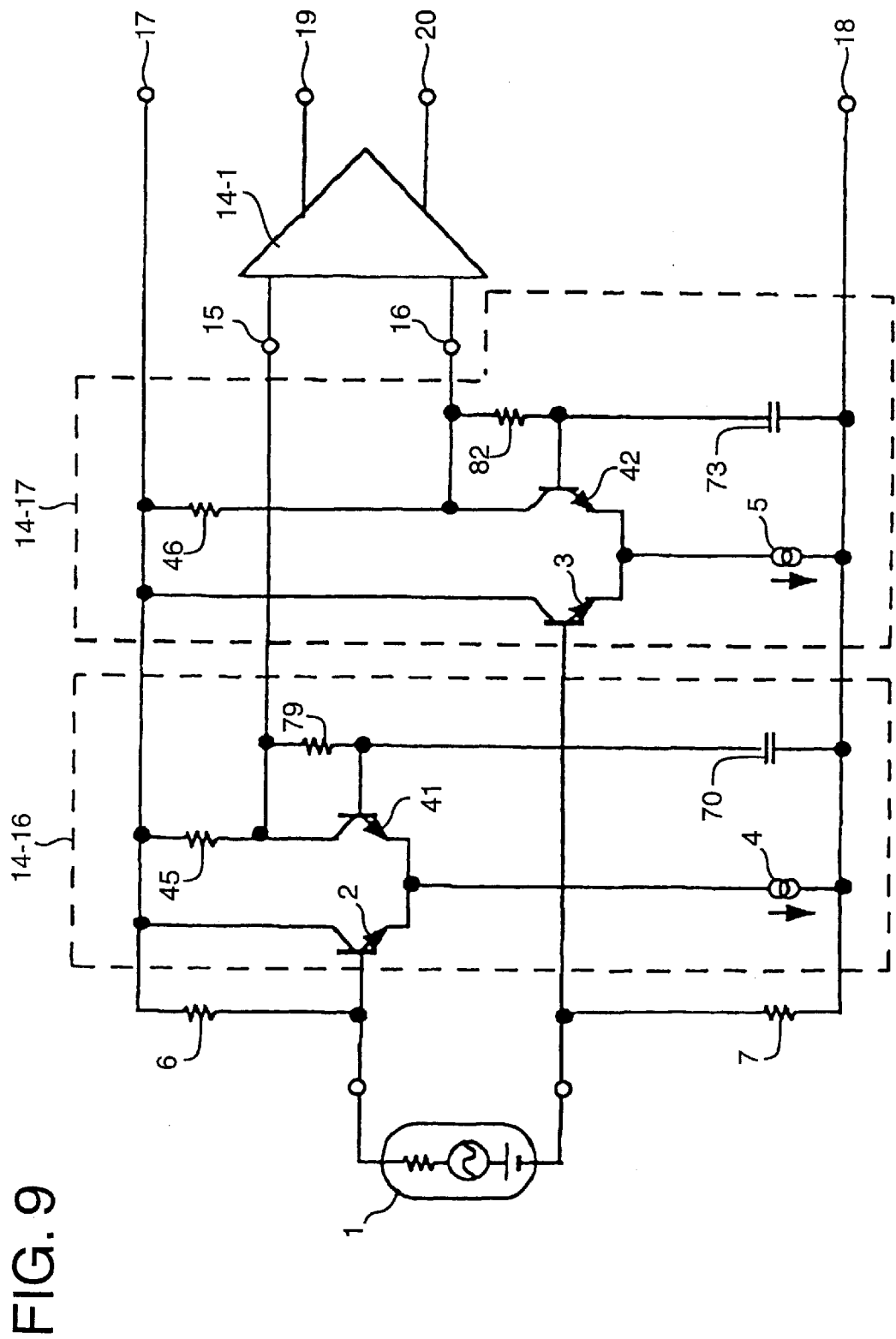
FIG. 9 is a circuit diagram showing a differential amplifier according to an eighth embodiment of the present invention.

In FIG. 9, reference numeral 1 denotes a signal source in which an AC voltage signal is superimposed on a DC voltage source, reference numerals 2 and 41 denote transistors constituting a differential pair of a first differential amplifier 14-16, and reference numerals 3 and 42 denote transistors constituting a differential pair of a second differential amplifier 14-17. Reference numerals 4 and 5 denote constant current sources for supplying almost the same currents to the differential pair of the first differential amplifier 14-16 and that of the second differential amplifier 14-17, respectively, and reference numeral 6 denotes a resistor for supplying a current to the base of each of the transistors 2 and 3 and for determining the electric potential of the signal source 1 together with a resistor 7. A resistor 79 and a capacitor 70 constitute an integrating circuit, their node is connected to the base of the transistor 41, and the other terminal of the resistor 79 is connected to the collector of the transistor 41. Similarly, a resistor 82 and a capacitor 73 constitute an integrating circuit, their node is connected to the base of the transistor 42, and the other terminal of the resistor 82 is connected to the collector of the transistor 42. Reference numeral 45 denotes a first load resistor of the transistor 41, and reference numeral 46 denotes a second load resistor of the transistor 42. The resistors 45 and 46 are constituted to have almost the same characteristics. A voltage signal is taken out from a node of the collector of the transistor 41 and the resistor 45, and is connected to one of the input terminals of the third differential amplifier 14-1 through a terminal 15. Similarly, a voltage signal is taken out from a node of the collector of the transistor 42 and the resistor 46, and is connected to the other input terminal of the third differential amplifier 14-1 through a terminal 16. Reference numerals 19 and 20 denote differential output terminals of the third differential amplifier 14-1 from which an amplified AC voltage differential signal can be obtained. Moreover, reference numeral 17 denotes a first voltage source, that is, a positive electrode power terminal in the present embodiment, and furthermore, reference numeral 18 denotes a second voltage source, that is, a negative electrode power terminal in the present embodiment.

Next, the operation of the eighth embodiment will be described.

The resistors 6 and 7 are serially connected to the signal source 1 in order to determine the circuit potential of the signal source 1, and the other terminal of the resistor 6 is connected to the positive electrode power terminal 17 and the other terminal of the resistor 7 is connected to the negative electrode power terminal 18. The resistor 6 also serves to produce a bias current to be supplied to the respective bases of the transistors 2 and 3. The transistors 2 and 41, the constant current source 4 and the resistor 45 constitute the first differential amplifier 14-16. Furthermore, a resistor feedback type voltage follower circuit to which a negative feedback is applied is constituted by the resistor 79. Therefore, the base voltage of the transistor 41 tries to be almost equal to the base voltage of the transistor 2. However, a low-pass filter (an integrating circuit) is constituted by the capacitor 70. Therefore, the negative feedback is not applied to an AC signal. More specifically, while the first differential amplifier 14-16 operates as a voltage follower circuit on a DC basis, and has a once voltage gain, it can be amplified on an AC basis. Similarly, the transistors 3 and 42, the constant current source 5 and the resistor 46 constitute the second differential amplifier 14-17. Furthermore, a resistor feedback type voltage follower circuit to which a negative feedback is applied is constituted by the resistor 82. Therefore, the base voltage of the transistor 42 tries to be almost equal to the base voltage of the transistor 3. However, a low-pass filter (an integrating circuit) is constituted by the capacitor 73. Therefore, the negative feedback is not applied to an AC signal. More specifically, while the second differential amplifier 14-17 operates as a voltage follower circuit on a DC basis, and has a once voltage gain, it can be amplified on an AC basis. The first differential amplifier 14-16 and the second differential amplifier 14-17 are constituted to have almost the same electrical characteristics. The output terminals of the first differential amplifier 14-16 and the second differential amplifier 14-17 are connected to the input terminals 15 and 16 of the third differential amplifier 14-1 respectively, thereby producing differential outputs on the output terminals 19 and 20. The transistors 2 and 3 constitute emitter follower type amplifiers (collector ground type amplifiers) respectively, and the AC voltage signals input to respective bases are output from emitters so that AC voltage signals converted to have a low impedance can be obtained.

The transistors 41 and 42 constitute base ground type amplifiers (cascade type amplifiers) respectively, and the AC voltage signals input to respective emitters are output from collectors so that AC current signals converted from a voltage to a current can be obtained.

These two AC current signals are supplied to the two load resistors 45 and 46 which are connected to the positive electrode source voltage 17 in common and have almost the same resistance values, respectively. Thus, two AC voltage signals converted from a current to a voltage can be obtained. These AC voltage signals are superimposed on the same voltage. These two AC voltage signals are input to the two input terminals 15 and 16 of the third differential amplifier 14-1, thereby producing differential outputs on the output terminals 19 and 20.

The setting of the voltage that is applied to the respective bases of the transistors 41 and 42 is important. In order to operate the first differential amplifier 14-16 and the second differential amplifier 14-17 as independent differential amplifiers respectively, voltages having mean values of the voltages of the respective bases of the transistors 2 and 3 are produced. In order to apply the voltages to the respective bases of the transistors 41 and 42, the negative feedback is applied by the first differential amplifier 14-16 and the second differential amplifier 14-17 on a DC basis respectively to set an equilibrium state, thereby supplying the voltage to the respective bases of the transistors 41 and 42 through the resistors 79 and 82. This method is an example of the above-mentioned third method.

As described above, in the present embodiment, it is necessary to cause the respective base currents of the transistors 41 and 42 to flow to the resistors 79 and 82. Therefore, the capacitances of the capacitors 66 and 68 should be increased with those of the resistors 79 and 82 reduced. Accordingly, although this method is preferred for explaining the principle, it also has the above-mentioned drawbacks. As compared with the prior art, however, it is possible to obtain a circuit in which a signal can be sent by direct connection of wiring without passing through two coupling capacitors in a differential amplifier manufactured by a semiconductor integrated circuit. Therefore, it is possible to obtain the effect of considerably improving the degree of freedom of a circuit design without considering the parasitic element of the coupling capacitor. Furthermore, while a chip area corresponding to two coupling capacitors built in the semiconductor integrated circuit can be reduced, there is a problem in that the areas of two integrating capacitors are required. As compared with the prior art, particularly, the influence of unnecessary parasitic capacities parasitic to the two built-in coupling capacitors can be eliminated. Therefore, a high frequency characteristic can be improved.

A ninth embodiment of the present invention will be described below with reference to the drawings.

Figure 10:
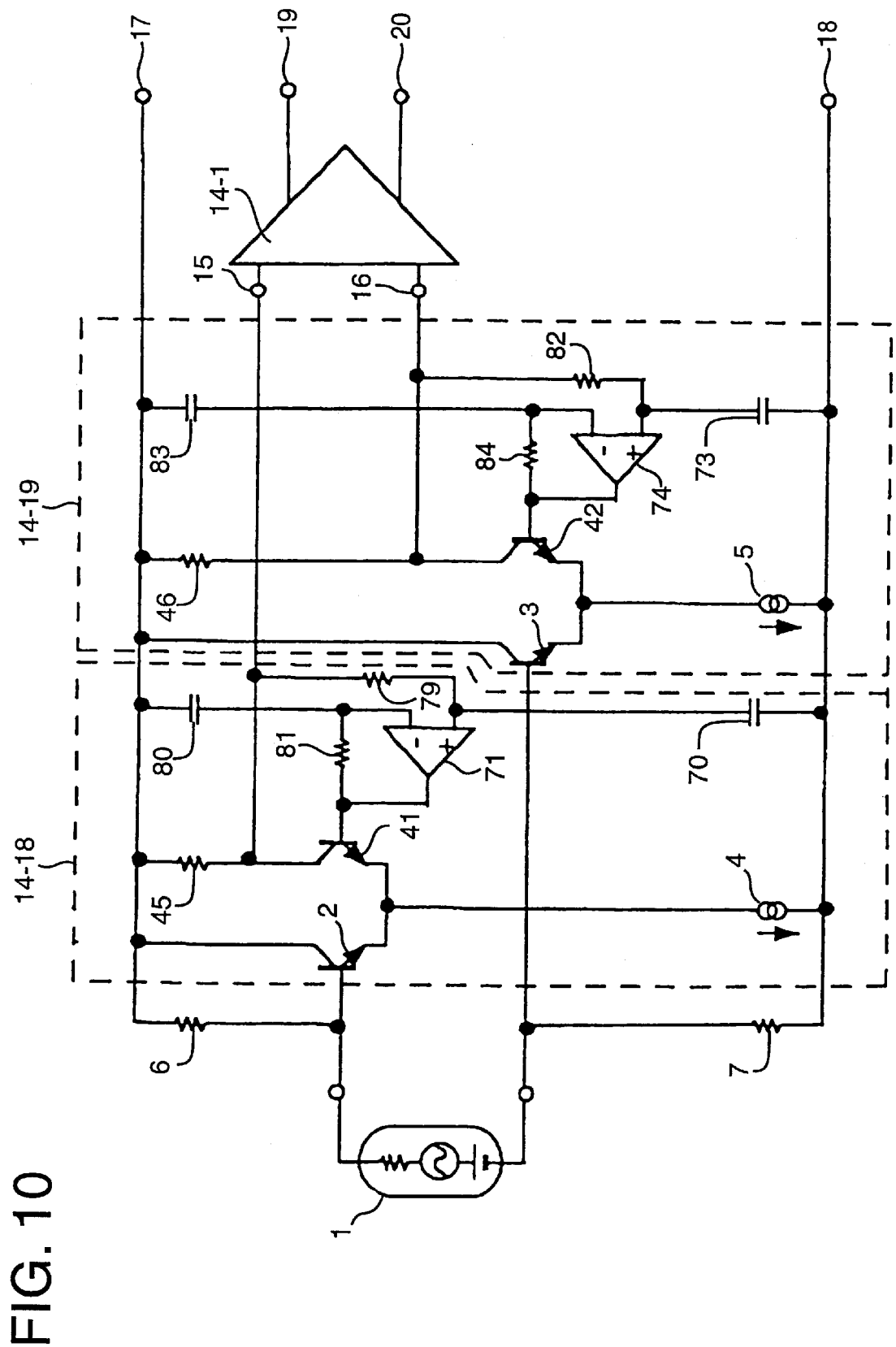
FIG. 10 is a circuit diagram showing a differential amplifier according to a ninth embodiment of the present invention.

In FIG. 10, reference numeral 1 denotes a signal source in which an AC voltage signal is superimposed on a DC voltage source, reference numerals 2 and 41 denote transistors constituting a differential pair of a first differential amplifier 14-18, and reference numerals 3 and 42 denote transistors constituting a differential pair of a second differential amplifier 14-19. Reference numerals 4 and 5 denote constant current sources for supplying almost the same currents to the differential pair of the first differential amplifier 14-18 and that of the second differential amplifier 14-19, respectively, and reference numeral 6 denotes a resistor for supplying a current to the base of each of the transistors 2 and 3 and for determining the electric potential of the signal source 1 together with a resistor 7. A resistor 79 and a capacitor 70 constitute an integrating circuit, and their node is connected to a non-inverting input terminal of an operational amplifier 71 and the other terminal of the resistor 79 is connected to the collector of the transistor 41. Furthermore, a feedback resistor (an integrating resistor) 81 is inserted between an inverting input terminal of the operational amplifier 71 and an output terminal to connect the output terminal of the operational amplifier 71 to the base of the transistor 41. Similarly, a resistor 82 and a capacitor 73 constitute an integrating circuit, and their node is connected to a non-inverting input terminal of an operational amplifier 74 and the other terminal of the resistor 82 is connected to the collector of the transistor 42. Furthermore, a feedback resistor (an integrating resistor) 84 is inserted between an inverting input terminal of the operational amplifier 74 and an output terminal to connect the output terminal of the operational amplifier 74 to the base of the transistor 42. Reference numeral 45 denotes a first load resistor of the transistor 41, and reference numeral 46 denotes a second load resistor of the transistor 42. The resistors 45 and 46 are constituted to have almost the same characteristics. A voltage signal is taken out from a node of the collector of the transistor 41 and the resistor 45, and is connected to one of the input terminals of the third differential amplifier 14-1 through a terminal 15. Similarly, a voltage signal is taken out from a node of the collector of the transistor 42 and the resistor 46, and is connected to the other input terminal of the third differential amplifier 14-1 through a terminal 16. Reference numerals 19 and 20 denote differential output terminals of the third differential amplifier 14-1 from which an amplified AC voltage differential signal can be obtained. Moreover, reference numeral 17 denotes a first voltage source, that is, a positive electrode power terminal in the present embodiment, and furthermore, reference numeral 18 denotes a second voltage source, that is, a negative electrode power terminal in the present embodiment.

Examples of the specific structures of the operational amplifiers 71 and 72 are shown in FIGS. 6A and 6B.

Next, the operation of the ninth embodiment will be described.

The resistors 6 and 7 are serially connected to the signal source 1 in order to determine the circuit potential of the signal source 1, and the other terminal of the resistor 6 is connected to the positive electrode power terminal 17 and the other terminal of the resistor 7 is connected to the negative electrode power terminal 18. The resistor 6 also serves to produce a bias current to be supplied to the respective bases of the transistors 2 and 3. The transistors 2 and 41, the constant current source 4 and the resistor 45 constitute the first differential amplifier 14-18. Furthermore, the resistor 79 and the operational amplifier 71 constitute a resistor feedback type voltage follower circuit to which a negative feedback is applied. Therefore, the base voltage of the transistor 41 tries to be almost equal to the base voltage of the transistor 2. However, a low-pass filter (an integrating circuit) is constituted by the capacitors 70 and 80. Therefore, the negative feedback is not applied to an AC signal. More specifically, while the first differential amplifier 14-18 operates as a voltage follower circuit on a DC basis and has a once voltage gain, it can be amplified on an AC basis. Similarly, the transistors 3 and 42, the constant current source 5 and the resistor 46 constitute the second differential amplifier 14-19. Furthermore, the resistor 82 and the operational amplifier 74 constitute a resistor feedback type voltage follower circuit to which a negative feedback is applied. Therefore, the base voltage of the transistor 42 tries to be almost equal to the base voltage of the transistor 3. However, a low-pass filter (an integrating circuit) is constituted by the capacitors 73 and 83. Therefore, the negative feedback is not applied to an AC signal. More specifically, while the second differential amplifier 14-19 operates as a voltage follower circuit on a DC basis and has a once voltage gain, it can be amplified on an AC basis. The first differential amplifier 14-18 and the second differential amplifier 14-19 are constituted to have almost the same electrical characteristics. The output terminals of the first differential amplifier 14-18 and the second differential amplifier 14-19 are connected to the input terminals 15 and 16 of the third differential amplifier 14-1 respectively, thereby producing differential outputs on the output terminals 19 and 20. The transistors 2 and 3 constitute emitter follower type amplifiers (collector ground type amplifiers) respectively, and the AC voltage signals input to respective bases are output from emitters so that AC voltage signals converted to have a low impedance can be obtained.

The transistors 41 and 42 constitute base ground type amplifiers (cascade type amplifiers) respectively, and the AC voltage signals input to respective emitters are output from collectors so that AC current signals converted from a voltage to a current can be obtained.

These two AC current signals are supplied to the two load resistors 45 and 46 which are connected to the positive electrode source voltage 17 in common and have almost the same resistance values, respectively. Thus, two AC voltage signals converted from a current to a voltage can be obtained. These AC voltage signals are superimposed on the same voltage. These two AC voltage signals are input to the two input terminals 15 and 16 of the third differential amplifier 14-1, thereby producing differential outputs on the output terminals 19 and 20.

The setting of the voltage that is applied to the respective bases of the transistors 41 and 42 is important. In order to operate the first differential amplifier 14-18 and the second differential amplifier 14-19 as independent differential amplifiers respectively, voltages having mean values of the voltages applied to the respective bases of the transistors 2 and 3 are produced. In order to apply the voltages to the respective bases of the transistors 41 and 42, the negative feedback is applied by the first differential amplifier 14-18 and the second differential amplifier 14-19 on a DC basis respectively to set an equilibrium state, thereby supplying the voltage to the respective bases of the transistors 41 and 42 through the resistors 79 and 82 and the operational amplifiers 71 and 74. This method is an example of the above-mentioned third method.

According to the present embodiment, the operational amplifiers 71 and 74 constitute a resistor feedback type voltage follower circuit to perform the impedance conversion as described above. Therefore, even if the values of the resistors 79 and 82 constituting the integrating circuit are increased, a voltage drop can be made very small. Consequently, the capacitances of the integrating capacitors 70 and 73 can be reduced. For example, if it is assumed that the input currents of the operational amplifiers 71 and 74 are 1 nA, the values of the resistors 79 and 82 are set to 1 MΩ with a voltage drop of 1 mV and it is sufficient that the capacitances of the integrating capacitors 70 and 73 for performing a differential amplification of 1 MHz or more are 1.6 pF and therefore, 3.2 pF for the two capacitors. A chip occupied area is 0.034 mm square, and the chip occupied areas of the operational amplifiers 71 and 74 are 0.02 mm square for the two capacitors in FIGS. 6A and 6B. Furthermore, the values of the resistors 81 and 84 constituting the integrating circuit can freely be set. Therefore, the capacitances of the integrating capacitors 80 and 83 can be reduced. For example, if the values of the integrating resistors (feedback resistors) 81 and 84 are set to 100 kΩ respectively, and a differential amplification of 1 MHz or more is to be performed, it is sufficient that the capacitances of the integrating capacitors 80 and 83 are 16 pF and therefore, 32 pF for the two capacitors. A chip occupied area is 0.1 mm square. Therefore, the total chip occupied area is 0.14 mm square. This chip occupied area is much smaller than a chip occupied area of 0.81 mm square for the two conventional coupling capacitors. According to the present embodiment, therefore, it is possible to obtain a circuit in which a signal can be sent by direction connection of wiring without passing through two coupling capacitors in a differential amplifier manufactured by a semiconductor integrated circuit. Therefore, it is possible to obtain the effect of considerably improving the degree of freedom of a circuit design without considering the parasitic element of the coupling capacitor. Furthermore, a chip area corresponding to the two coupling capacitors built in the semiconductor integrated circuit can be reduced. As compared with the prior art, particularly, the influence of unnecessary parasitic capacities parasitic to the two built-in coupling capacitors can be eliminated. Therefore, a high frequency characteristic can be improved. In addition, the manufacturing cost of the semiconductor integrated circuit can be cut down due to the reduction in the chip area.

A tenth embodiment of the present invention will be described below with reference to the drawings.

Figure 11:
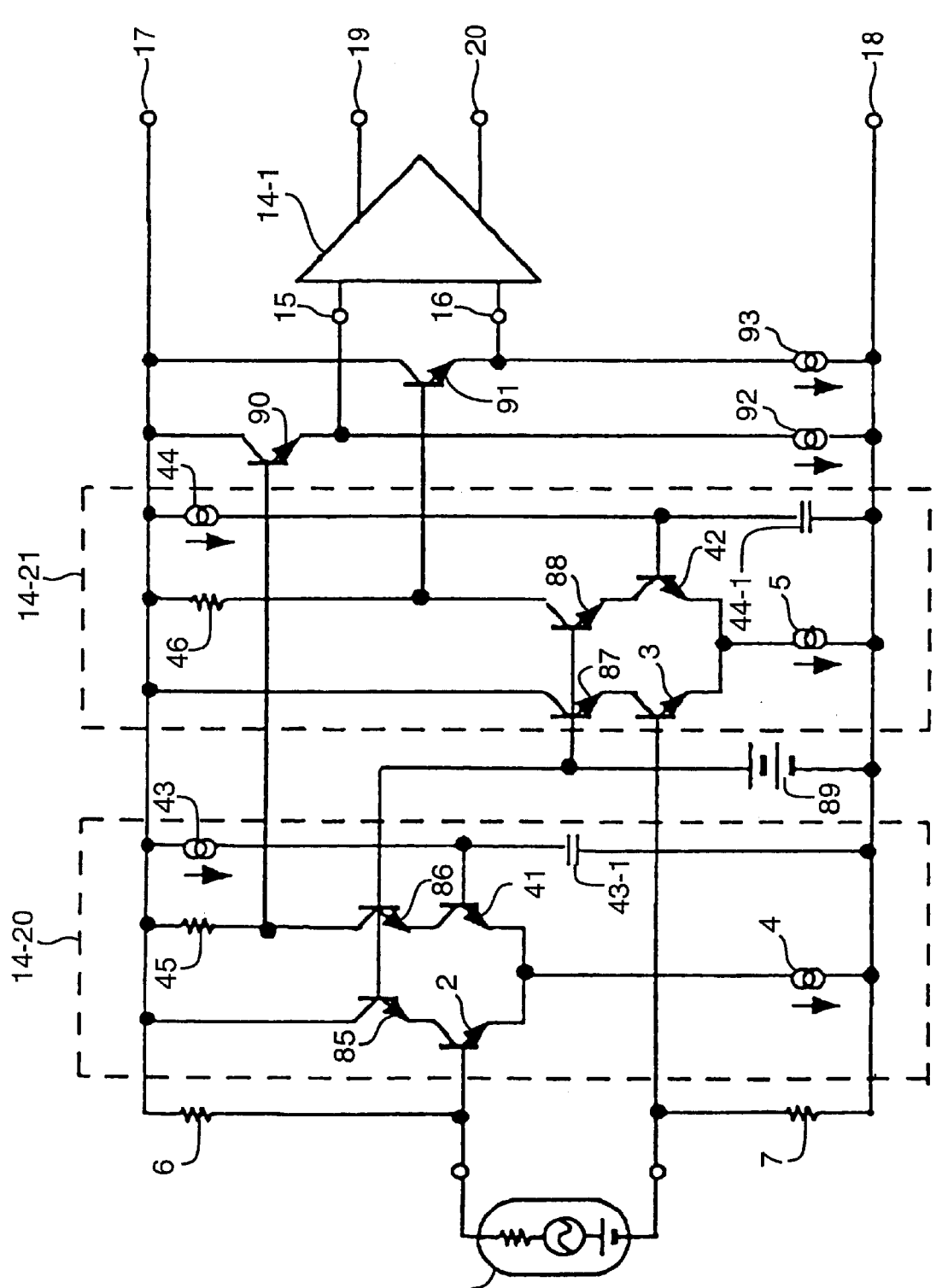
FIG. 11 is a circuit diagram showing a differential amplifier according to a tenth embodiment of the present invention.

In FIG. 11, reference numeral 1 denotes a signal source in which an AC voltage signal is superimposed on a DC voltage source, reference numerals 2 and 41 denote transistors constituting a differential pair of a first differential amplifier 14-20, and reference numerals 3 and 42 denote transistors constituting a differential pair of a second differential amplifier 14-21. Reference numerals 4 and 5 denote constant current sources for supplying almost the same currents to the differential pair of the first differential amplifier 14-20 and that of the second differential amplifier 14-21, respectively. Reference numeral 6 denotes a resistor for supplying a current to the base of each of the transistors 2 and 3 and for determining the electric potential of the signal source 1 together with a resistor 7. Reference numerals 43 and 43-1 constitute a first current source which is set to cause a current having a value almost equal to a mean value of the current flowing to the base of the transistor 2 to flow, thereby supplying the base current of the transistor 41. Similarly, reference numerals 44 and 44-1 constitute a second current source which is set to cause a current having a value almost equal to a mean value of the current flowing to the base of the transistor 3 to flow, thereby supplying the base current of the transistor 42. Reference numerals 85 and 86 and reference numerals 87 and 88 denote transistors having bases connected in common and are connected to a DC voltage source 89 to be inserted in the collector sections of the respective transistors of the two differential pairs. Reference numeral 45 denotes a first load resistor of the transistors 41 and 86, and reference numeral 46 denotes a second load resistor of the transistors 42 and 88. The resistors 45 and 46 are constituted to have almost the same characteristics. A voltage signal is taken out from a node of the collector of the transistor 86 and the resistor 45, and an emitter follower circuit is constituted by a transistor 90 and a constant current source 92 and is connected to one of the input terminals of the third differential amplifier 14-1 through a terminal 15. Similarly, a voltage signal is taken out from a node of the collector of the transistor 88 and the resistor 46, an emitter follower circuit is constituted by a transistor 91 and a constant current source 93 and is connected to the other input terminal of the third differential amplifier 14-1 through a terminal 16. Reference numerals 19 and 20 denote differential output terminals of the third differential amplifier 14-1 from which an amplified AC voltage differential signal can be obtained. Moreover, the transistors 85 and 86, the transistors 87 and 88 and the transistors 90 and 91 which are to be used have almost the same characteristics, and the constant current sources 92 and 93 to be used also have almost the same characteristics. Furthermore, reference numeral 17 denotes a first voltage source, that is, a positive electrode power terminal in the present embodiment, and reference numeral 18 denotes a second voltage source, that is, a negative electrode power terminal in the present embodiment.

Next, the operation of the tenth embodiment will be described.

The resistors 6 and 7 are serially connected to the signal source 1 in order to determine the circuit potential of the signal source 1, and the other terminal of the resistor 6 is connected to the positive electrode power terminal 17 and the other terminal of the resistor 7 is connected to the negative electrode power terminal 18. The resistor 6 also serves to produce a bias current to be supplied to the respective bases of the transistors 2 and 3. The transistors 2 and 41, the constant current source 4, the first current sources 43 and 43-1, the transistors 85 and 86, and the resistor 45 constitute the first differential amplifier 14-20, and the transistors 3 and 42, the constant current source 5, the second current sources 44 and 44-1, the transistors 87 and 88, and the resistor 46 constitute the second differential amplifier 14-21. The first differential amplifier 14-20 and the second differential amplifier 14-21 are constituted to have almost the same electrical characteristics. The outputs of the first differential amplifier 14-20 and the second differential amplifier 14-21 are buffer amplified through the respective emitter follower circuits of the transistor 90 and constant current source 92 and the transistor 91 and constant current source 93, and are connected to the input terminals 15 and 16 of the third differential amplifier 14-1 respectively, thereby producing differential outputs on the output terminals 19 and 20.

The transistors 2 and 3 constitute emitter follower type amplifiers (collector ground type amplifiers) respectively, and the AC voltage signals input to respective bases are output from emitters so that AC voltage signals converted to have a low impedance can be obtained.

The transistors 41 and 42 constitute base ground type amplifiers (cascade type amplifiers) respectively, and the AC voltage signals input to respective emitters are output from collectors so that AC voltage signals converted from a voltage to a current can be obtained.

A signal is sent from an emitter to a collector through base ground type amplifiers constituted by the transistors 85 and 86 and the transistors 87 and 88, and the collector potentials of the two differential pairs are set equal to improve the balanced characteristics. In addition, the impedance of the collector sections of the transistors constituting the differential pair is reduced to improve the delay of the operation caused by the parasitic capacities of the collector sections.

AC current signals are obtained on the respective collectors of the transistors 86 and 88.

These two AC current signals are supplied to the two load resistors 45 and 46 which are connected to the positive electrode source voltage 17 in common and have almost the same resistance values, respectively. Thus, two AC voltage signals converted from a current to a voltage can be obtained. These AC voltage signals are superimposed on the same voltage, and are buffer amplified by the respective emitter follower circuits of the transistor 90 and constant current source 92 and the transistor 91 and constant current source 93. These two AC voltage signals are input to the two input terminals 15 and 16 of the third differential amplifier 14-1, thereby producing differential outputs on the output terminals 19 and 20.

A current to flow to each of the bases of the transistors 41 and 42 should be set as follows. In order to operate the first differential amplifier 14-20 and the second differential amplifier 14-21 as independent differential amplifiers respectively, currents having mean values of the currents flowing to the respective bases of the transistors 2 and 3 are produced and are caused to flow to the respective bases of the transistors 41 and 42. The transistors 86 and 88 can have almost the same characteristics by removing the transistors 85 and 87 in the present embodiment. Moreover, the collectors of the transistors 86 and 88 may be directly connected to the input terminals 15 and 16 of the third differential amplifier 14-1 by removing the transistors 90 and 91 and the constant current sources 92 and 93. Furthermore, while the examples of the first current sources 43 and 43-1 and the second current sources 44 and 44-1 have been described in the present embodiment, the same effects can be obtained even if the examples of the present embodiment are applied to the third voltage source 47 and the fourth voltage source 48 as shown in FIG. 2.

By the above-mentioned circuit structure, the characteristics of the differential amplifier according to the present invention, for example, a frequency characteristic, a common-mode rejection characteristic, a power noise removing characteristic, and the like can be improved.

An eleventh embodiment of the present invention will be described below with reference to the drawings.

Figure 12:
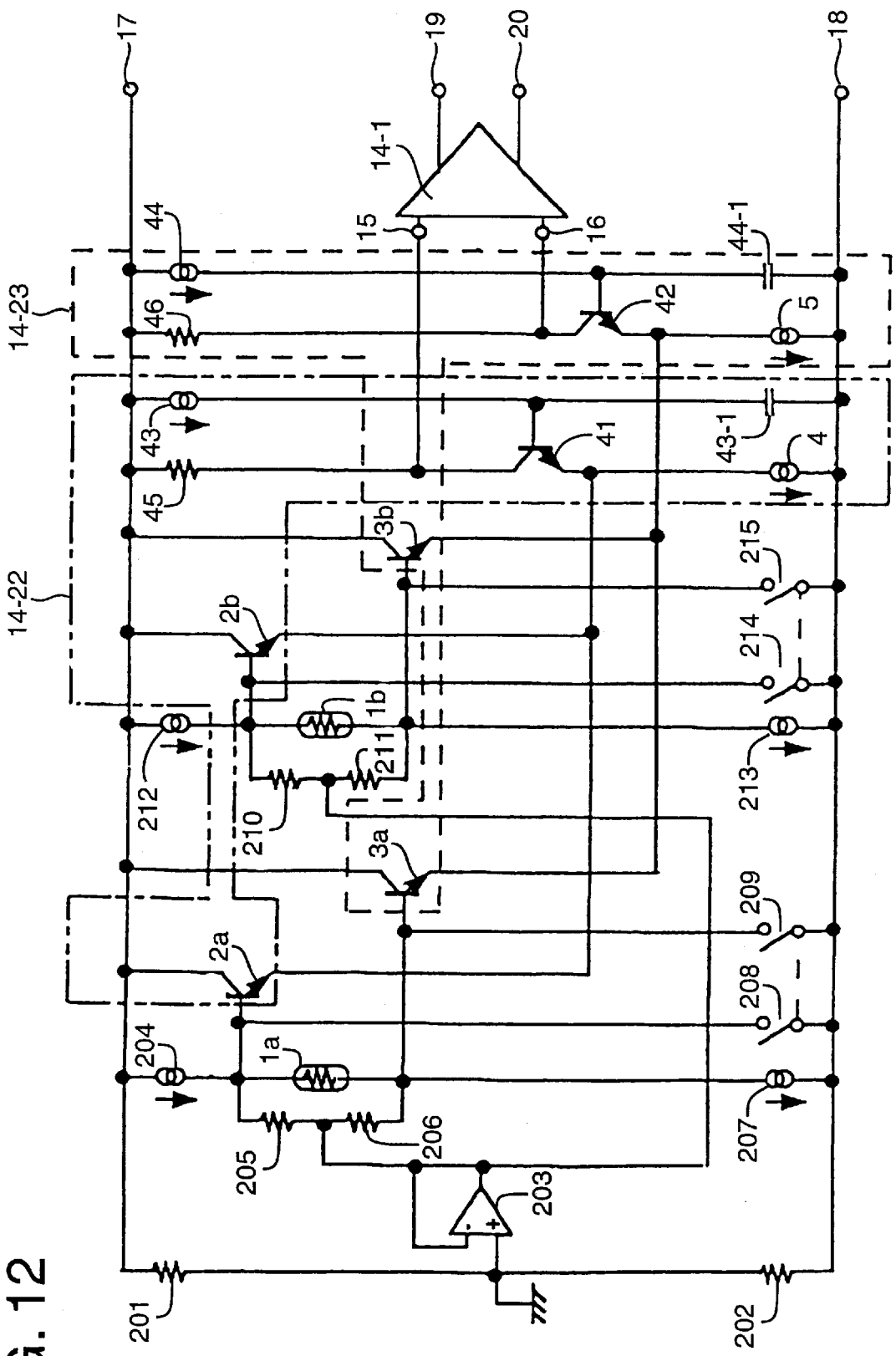
FIG. 12 is a circuit diagram showing a differential amplifier according to an eleventh embodiment of the present invention.
Figure 13:
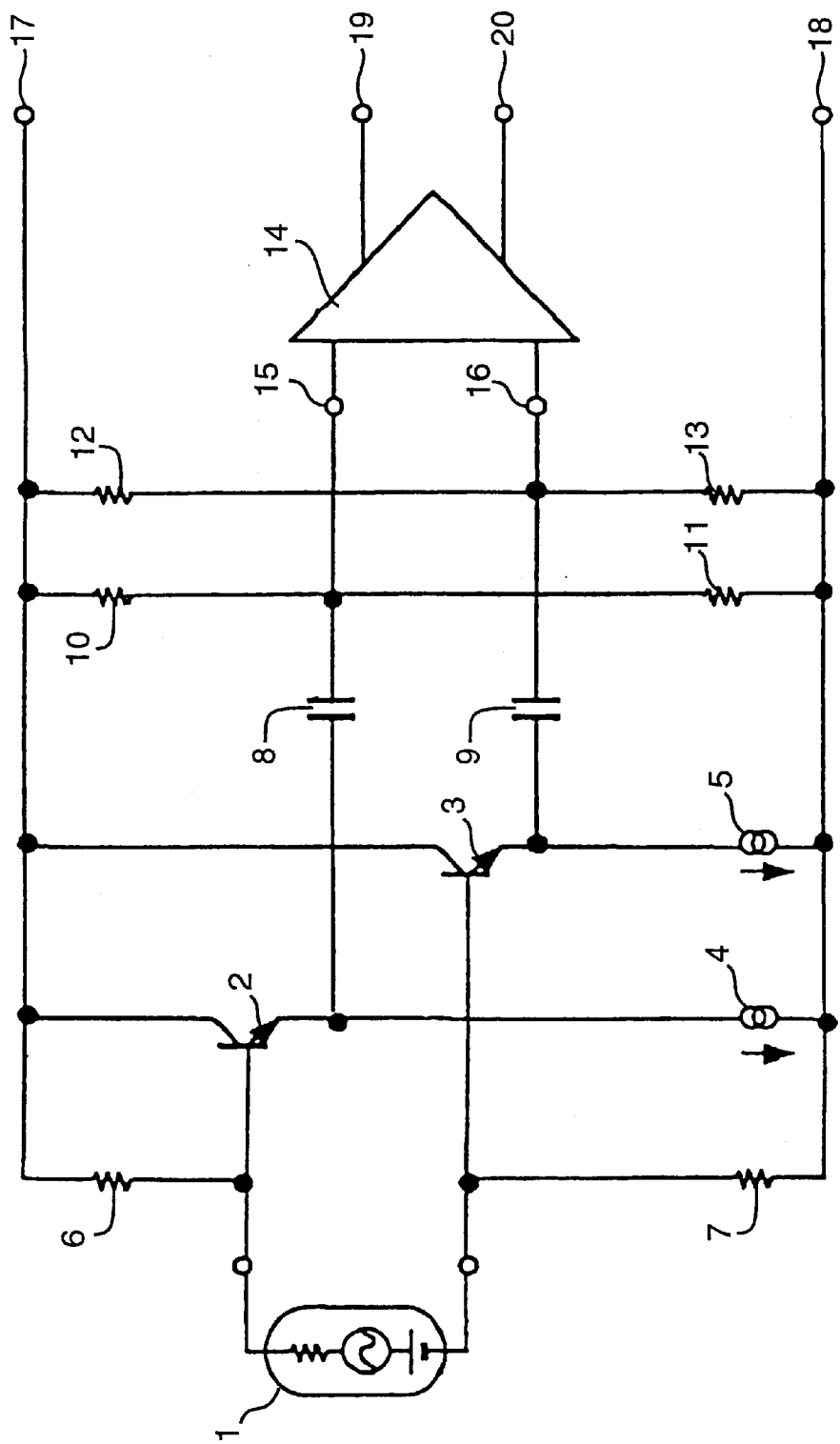
FIG. 13 is a circuit diagram showing a conventional differential amplifier.

FIG. 12 illustrates an example in which a plurality of signal sources 1a and 1b can be switched for input, wherein two signal sources 1a and 1b are provided. Also in the case where more signal sources than in the present embodiment, that is, N signal sources (N will hereinafter represent an integer of 2 or more) are connected, implementation can be performed with the same structure. The split voltages of resistors 201 and 202 are set to the reference voltages of the signal sources 1a and 1b, are converted into a low impedance voltages by an operational amplifier 203, and are supplied to resistors 205 and 206 and resistors 210 and 211, respectively. Thus, the electric potentials of the signal sources 1a and 1b are determined. Constant current sources 204 and 207 and constant current sources 212 and 213 are constituted to bias the signal sources 1a and 1b. Respective input side circuits constituted by transistors 2a and 2b of one of differential pairs of a first differential amplifier 14-22 are connected in parallel, each base is connected to one of terminals of each of the signal sources 1a and 1b, respective input side circuits constituted by transistors 3a and 3b of one of differential pairs of a second differential amplifier 14-23 are connected in parallel, and each base is connected to the other terminal of each of the signal sources 1a and 1b. Accordingly, the differential pair of the first differential amplifier 14-22 can make a set of the transistors 2a and 41 and a set of the transistors 2b and 41, and the differential pair of the second differential amplifier 14-23 can make a set of the transistors 3a and 42 and a set of the transistors 3b and 42. The other transistor 41 of each differential pair of the first differential amplifier 14-22 is shared, and the other transistor 42 of each differential pair of the second differential amplifier 14-23 is shared. Furthermore, the first differential amplifier 14-22 is constituted by adding a constant current source 4, a first load resistor 45 and first current sources 43 and 43-1 for supplying a current having a mean value of a current flowing to the base of the transistor 2a or 2b, and the second differential amplifier 14-23 is constituted by adding a constant current source 5, a second load resistor 46 and second current sources 44 and 44-1 for supplying a current having a mean value of a current flowing to the base of the transistor 3a or 3b. These circuits are shared for the signal sources 1a and 1b. A node of the collector of the transistor 41 and the resistor 45 is connected to the third differential amplifier 14-1 through an input terminal 15. Similarly, a node of the collector of the transistor 42 and the resistor 46 is connected to the third differential amplifier 14-1 through an input terminal 16. Differential outputs are obtained from output terminals 19 and 20 of the third differential amplifier 14-1. Moreover, in order to stop the operations of the transistors of the input side circuits other than two transistors connected to one signal source in the transistors constituting the respective input side circuits to which the signal sources 1a and 1b are connected, each of switches 208 and 209 and switches 214 and 215 is connected to the base of each of the transistors of the input side circuits. Thus, each switch is provided such that one of the signal sources 1a and 1b can be selected and amplified. A switch selecting circuit for controlling each switch is provided. While the switch selecting circuit is not shown, it is constituted by a logic circuit and a semiconductor switch circuit.

Next, the operation of the eleventh embodiment will be described.

A reference voltage for determining each of the electric potentials of the signal sources 1a and 1b is produced by the voltage splits circuit of the resistors 201 and 202, is converted into a low impedance reference voltage by the voltage follower circuit of the operational amplifier 203, and is supplied to the nodes of the resistors 205 and 206 and the resistors 210 and 211 which serve to set the electric potentials of the signal sources 1a and 1b, respectively. Moreover, the constant current sources 204 and 207 and the constant current sources 212 and 213 are connected in series to set the bias currents of the signal sources 1a and 1b and to supply a base current to the transistor 2a or 2b and the transistor 3a or 3b, respectively. Furthermore, the switches 208 and 209 and the switches 214 and 215 which stop the operations of the transistors 2a and 3a or 2b and 3b are operated interlockingly. For these switches are used semiconductor switches. Each switch is controlled with a logic circuit provided separately. More specifically, two input side circuits of one of the differential pairs including the first differential amplifier 14-22 and the second differential amplifier 14-23 which have the two signal sources 1a and 1b connected thereto are provided and connected in parallel, and a selecting circuit for stopping the operations of the input side circuits except for one of the two input side circuits, is provided such that one of the two signal sources can be selected and amplified. While the example in which the two signal sources 1a and 1b are used have been described to easily understand the description, N signal sources are actually used and N input side circuits of one of the differential pairs having the corresponding N first and second differential amplifiers 14-22 and 14-23 are provided and connected in parallel, and N sets of switches for stopping the operations of the input side circuits other than one of the N input side circuits are actuated such that one of the N signal sources can be selected and amplified. As described above, in the case where the signals of the signal sources are to be selected and amplified, the selecting circuit is constituted by a digital circuit. Additionally, the whole circuit scale can be reduced and a manufacturing cost can be cut down. Furthermore, the number of a part of the input circuit portions of the differential amplifiers is set equal to that of the signal sources, and the whole differential amplifier excluding the residual input circuit portions is shared. Consequently, the circuit portions which are always shared can be kept in the operation state. Therefore, it is possible to increase the speed of a response time taken before the signal sources are switched to obtain the differential outputs as the whole circuit. Furthermore, the power consumption of the whole circuit can be reduced by the sharing.

A twelfth embodiment of the present invention will be described below with reference to the drawings.

In FIG. 12, there has been illustrated an example in which a plurality of signal sources can be switched for input and a magnetoresistive head (MRH) or the like is used as signal sources 1a and 1b. The magnetoresistive head requires a bias current. While constant current sources 204 and 207, and 212 and 213 have been used for the magnetoresistive heads 1a and 1b in FIG. 12, a bias can also be applied to each magnetoresistive head by one constant current source. In that case, for example, one of the constant current sources 204 and 207 may be replaced with a resistor for the magnetoresistive element 1a of FIG. 12. Furthermore, signals generated on the magnetoresistive elements can be selected and differentially amplified. Therefore, for example, in the case of application to a magnetic disk memory for an electronic computer, a place where each magnetoresistive head is to be provided is concerned, that is, the magnetoresistive head should be provided on the tip of each suspension. Consequently, a distance between the magnetoresistive head and the input terminal of the differential amplifier should be connected by a wiring because the function of the suspension is kept with difficulty and the wiring portion becomes an antenna to mix electromagnetic wave noises. In this case, if the differential amplifier according to the present invention is used, the size and weight of a semiconductor chip can be more reduced than in the conventional differential amplifier having coupling capacitors provided therein. Consequently, the semiconductor chip can be provided near the magnetoresistive head of the suspension and the wiring portion can be shortened. Thus, the mixture of the electromagnetic wave noises can be decreased, and furthermore, a micro signal generated by the magnetoresistive head can be amplified and output by the common-mode rejection characteristic of the differential amplifier.

A thirteenth embodiment of the present invention will be described below with reference to the drawings.

There has been illustrated, as in FIG. 12, an example in which a plurality of signal sources can be switched for input and a magnetoresistive head is used as signal sources 1a and 1b. In FIG. 12, it is sufficient that the resistors 205 and 206 and the resistors 210 and 211 are removed and the signal sources 1a and 1b are replaced with 3-terminal elements (distorted resistance detecting elements or the like) respectively and the terminals of center taps of the 3-terminal elements are connected to the output terminals of the operational amplifier 203. According to such a connection, a differential amplification can be performed by the differential amplifier according to the present invention in the same manner as in the case where 2-terminal signal sources are to be used. Moreover, the differential amplification of a multi-terminal element (the magnetoresistive head, the distorted resistance detecting element or the like) corresponding to a two-dimension or three-dimension can also be performed by using a plurality of differential amplifiers according to the present invention. While the case where the center tap of the 3-terminal element is set to a reference voltage has been described above, an optional terminal of the 3-terminal element may be set to the reference voltage. If the signal of the output terminal is defined according to the setting of the reference voltage, the differential amplifier according to the present invention can be used in the same manner as in the case where the center tap of the 3-terminal element is set to the reference voltage.

While a bipolar type transistor has been used for the transistor in the above-mentioned embodiments, the present invention can be constituted by using a MOS type transistor and a junction FET type transistor, and furthermore, a semiconductor device such as an FEMT type transistor or a combination thereof.

Since the present invention has the above-mentioned structure, the following effects can be obtained.

According to the first aspect of the present invention, a differential amplifier comprises a first differential amplifier and a second differential amplifier, having one input terminals to which respective terminals of a signal source are connected, and a third differential amplifier having input terminals to which an output terminal of the first differential amplifier and an output terminal of the second differential amplifier are respectively connected. Therefore, an AC voltage signal is taken out by blocking a DC voltage without requiring coupling capacitors. Consequently, in a semiconductor integrated circuit, it is not necessary to fabricate the coupling capacitor on a chip. Thus, a chip area can be reduced, and therefore, a manufacturing cost can be cut down.

Further, when the frequency of the AC voltage signal to be amplified is required in a low band, a wiring has conventionally been lead to the outside of the chip to attach the individual parts of the coupling capacitor. However, in the first aspect of the present invention, it is not necessary to lead the wiring to the outside of the chip and it is not necessary to provide a terminal for leading the wiring to the outside of the chip. In the first aspect of the present invention, furthermore, a passing frequency characteristic has no influence by the coupling capacitor. Therefore, it is possible to amplify a wide frequency band from a DC region to a high frequency.

According to the second aspect of the present invention, the other input terminal of the first differential amplifier and the other input terminal of the second differential amplifier are set such that current having values almost equal to mean values of currents flowing to the respective one input terminals flow. According to such a simple structure, in a semiconductor integrated circuit, it is not necessary to fabricate a coupling capacitor on a chip. Consequently, a chip area can be reduced, and therefore, a manufacturing cost can be cut down. Moreover, a passing frequency characteristic has no influence by the coupling capacitor. Therefore, it is possible to amplify a wide frequency band from a DC region to a high frequency.

According to the third aspect of the present invention, the other input terminal of the first differential amplifier and the other input terminal of the second differential amplifier are set such that a current having a value almost equal to a mean value of a voltage applied to one of the input terminals flows. According to such a simple structure, in a semiconductor integrated circuit, it is not necessary to fabricate a coupling capacitor on a chip. Consequently, a chip area can be reduced, and therefore, a manufacturing cost can be cut down. Moreover, a passing frequency characteristic has no influence by the coupling capacitor. Therefore, it is possible to amplify a wide frequency band from a DC region to a high frequency.

According to the fourth aspect of the present invention, the output terminal of the first differential amplifier and the output terminal of the second differential amplifier are caused to output respective current signals. According to such a simple structure, in a semiconductor integrated circuit, it is not necessary to fabricate a coupling capacitor on a chip. Consequently, a chip area can be reduced, and therefore, a manufacturing cost can be cut down. Moreover, a passing frequency characteristic has no influence by the coupling capacitor. Therefore, it is possible to amplify a wide frequency band from a DC region to a high frequency. If the next stage is constituted by a current differential amplifier for current input, restrictions on a source voltage related to a voltage dynamic range are eliminated so that an operation can be performed by a lower voltage source. Thus, power consumption can be reduced and a power source can easily be designed.

According to the fifth aspect of the present invention, the output terminal of the first differential amplifier and the output terminal of the second differential amplifier are caused to output signals respectively converted into voltage signals by load circuits. According to such a simple structure, in a semiconductor integrated circuit, it is not necessary to fabricate a coupling capacitor on a chip. Consequently, a chip area can be reduced, and therefore, a manufacturing cost can be cut down. Moreover, a passing frequency characteristic has no influence by the coupling capacitor. Therefore, it is possible to amplify a wide frequency band from a DC region to a high frequency.

According to the sixth aspect of the present invention, a plurality of the first differential amplifiers are provided, and furthermore, a plurality of the second differential amplifiers are provided, and the selecting unit for selecting one of the plurality of the first differential amplifiers and one of the plurality of the second differential amplifiers is provided. Therefore, the present invention can also cope with a plurality of signal sources.

According to the seventh aspect of the present invention, each of the first differential amplifier and the second differential amplifier has such a structure that the one input terminals and the other input terminal are respectively connected to the respective bases of a pair of transistors having emitters connected in common and connected to one end of a first constant current source, the other input terminal is connected to one end of a second constant current source having the other end connected to a first voltage source and is furthermore connected to one end of a capacitor having the other terminal connected to a second voltage source, the other terminal of the first constant current source is connected to the second voltage source, and a collector of a transistor having a base to which the other input terminal of one of the transistors is connected is connected to one of terminals of a resistor having the other terminal connected to the first voltage source, and an output is taken out from the collector. In a semiconductor integrated circuit, therefore, it is not necessary to fabricate a coupling capacitor on a chip. Consequently, a chip area can be reduced, and therefore, a manufacturing cost can be cut down. Moreover, a passing frequency characteristic has no influence by the coupling capacitor. Therefore, it is possible to amplify a wide frequency band from a DC region to a high frequency.

According to the eighth aspect of the present invention, each of the first differential amplifier and the second differential amplifier has such a structure that the one input terminals and the other input terminal are respectively connected to the respective bases of a pair of transistors having emitters connected in common and connected to one end of a constant current source, the other input terminal is connected to a third voltage source, an output is taken out from the collector of the transistor having the base to which the other input terminal is connected, and is connected to one end of a resistor having the other end connected to the first voltage source. In a semiconductor integrated circuit, therefore, it is not necessary to fabricate a coupling capacitor on a chip. Consequently, a chip area can be reduced, and therefore, a manufacturing cost can be cut down. Moreover, a passing frequency characteristic has no influence by the coupling capacitor. Therefore, it is possible to amplify a wide frequency band from a DC region to a high frequency.

According to the ninth aspect of the present invention, the first constant current source is interlocked with the second constant current source by a mirror circuit. Therefore, it is easy to set a current having a value almost equal to a mean value of a current flowing to one of the input terminals to flow to the other input terminal.

According to the tenth aspect of the present invention, the third voltage source takes out a voltage from the one input terminal, thereby producing a voltage by an integrating circuit. Therefore, it is easy to set a voltage having a value almost equal to a mean value of a voltage applied to one of the input terminals to be generated on the other input terminal.

According to the eleventh aspect of the present invention, the third voltage source takes out a voltage from the one input terminal, thereby producing a voltage by an integrating circuit and an operational amplifier. Therefore, it is easy to set a voltage having a value almost equal to a mean value of a voltage applied to one of the input terminals to be generated on the other input terminal.

According to the twelfth aspect of the present invention, values of currents flowing to the other input terminals can be adjusted based on output values of the output terminal of the first differential amplifier and the output terminal of the second differential amplifier. Therefore, it is easy to set a current having a value almost equal to a mean value of a current flowing to one of the input terminals to flow to the other input terminal.

According to the thirteenth aspect of the present invention, values of voltages generated on the other input terminals can be adjusted based on output values of the output terminal of the first differential amplifier and the output terminal of the second differential amplifier. Therefore, it is easy to set a voltage having a value almost equal to a mean value of a voltage applied to one of the input terminals to be generated on the other input terminal.

According to the fourteenth aspect of the present invention, the signal source can also be applied to a 3-terminal element having one of terminals set to a reference potential.

According to the fifteenth aspect of the present invention, the signal source can also be applied to a magnetoresistive element.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A differential amplifier circuit for processing a signal including an AC voltage signal superimposed on a DC voltage, said amplifier comprising:
a first differential amplifier having first and second input terminals and a second differential amplifier having first and second input terminals, the first input terminal of said first differential amplifier being connected to a first terminal of a signal source and the first input terminal of said second differential amplifier being connected to a second terminal of the signal source; and a third differential amplifier having first and second input terminals to which an output terminal of said first differential amplifier and an output terminal of said second differential amplifier are respectively connected, wherein the second input terminal of said first differential amplifier and the second input terminal of said second differential amplifier are connected so that currents having values almost equal to mean values of currents flowing to the respective first input terminals of said first and second differential amplifiers flow at the second input terminals of the first and second differential amplifiers.

2. A differential amplifier circuit for processing a signal including an AC voltage signal superimposed on a DC voltage, said amplifier comprising:

a first differential amplifier having first and second input terminals and a second differential amplifier having first and second input terminals, the first input terminal of said first differential amplifier being connected to a first terminal of a signal source and the first input terminal of said second differential amplifier being connected to a second terminal of the signal source; and a third differential amplifier having first and second input terminals to which an output terminal of said first differential amplifier and an output terminal of said second differential amplifier are respectively connected, wherein the second input terminal of said first differential amplifier and the second input terminal of said second differential amplifier are connected so that voltages having values almost equal to mean values of voltages applied to the respective first input terminals of said first and second differential amplifiers are generated at the second input terminals of the first and second differential amplifiers.

3. The differential amplifier circuit according to claim 1, wherein said first differential amplifier and said second differential amplifier output respective current signals at their respective output terminals.

4. The differential amplifier circuit according to claim 1, wherein said first differential amplifier and said second differential amplifier output signals at their respective output terminals respectively converted into voltage signals by load circuits.

5. The differential amplifier circuit according to claim 1, including a plurality of first differential amplifiers having respective first input terminals connected to respective first terminals of a plurality of signal sources, and a plurality of said second differential amplifiers having respective first input terminals connected to respective second terminals of the plurality of signal sources, and a selecting circuit for selecting one of the plurality of signal sources for amplification by one of the plurality of said first differential amplifiers and one of the plurality of said second differential amplifiers.

6. The differential amplifier circuit according to claim 1, wherein each of said first and said second differential amplifiers includes first and second transistors having respective bases, emitters, and collectors, the base of the first transistor being the first input terminal, the base of the second transistor being the second input terminal, the emitters of the first and second transistor being connected in common, a first constant current source connected to the emitters, a capacitor, a second constant current source connected at a first terminal to the second input terminal and connected at a second terminal to a voltage source and to said capacitor, and a resistor, the collector of said second transistor being connected to said resistor, an output being taken from the collector of said second transistor.

7. The differential amplifier circuit according to claim 2, wherein each of said first and said second differential amplifiers includes first and second transistors having respective bases, emitters, and collectors, the base of the first transistor being the first input terminal, the base of the second transistor being the second input terminal, the emitters of the first and second transistor being connected in common, a constant current source connected to the emitters, a voltage source connected to the second input terminal, an output being taken from the collector of the second transistor, and a resistor connected between the voltage source and the collector of said second transistor.

8. The differential amplifier circuit according to claim 6, including a current mirror circuit wherein said first constant current source is interlocked with said second constant current source by said current mirror circuit.

9. The differential amplifier circuit according to claim 7, wherein said voltage source takes a voltage from the first input terminal for producing a voltage with an integrating circuit.

10. The differential amplifier circuit according to claim 7, wherein said voltage source takes a voltage from the first input terminal for producing a voltage with an integrating circuit and an operational amplifier.

11. The differential amplifier circuit according to claim 1, wherein currents flowing to the second input terminals can be adjusted based on output values at the output terminals of said first and second differential amplifiers.

12. The differential amplifier circuit according to claim 2, wherein voltages generated at the second input terminals can be adjusted based on output values at the output terminals of said first and second differential amplifiers.

13. The differential amplifier circuit according to claim 1, wherein the signal source is a 3-terminal element having one terminal set to a reference potential.

14. The differential amplifier circuit according to claim 1, wherein the signal source is a magnetoresistive element.

15. The differential amplifier circuit according to claim 2, wherein said first differential amplifier and said second differential amplifier output respective current signals at their respective output terminals.

16. The differential amplifier circuit according to claim 2, wherein said first differential amplifier and said second differential amplifier output signals at their respective output terminals respectively converted into voltage signals by load circuits.

17. The differential amplifier circuit according to claim 2, including a plurality of first differential amplifiers having respective first input terminals connected to respective first terminals of a plurality of signal sources, and a plurality of said second differential amplifiers having respective first input terminals connected to respective second terminals of the plurality of signal sources, and a selecting circuit for selecting one of the plurality of signal sources for amplification by one of the plurality of said first differential amplifiers and one of the plurality of said second differential amplifiers.

18. The differential amplifier circuit according to claim 2, wherein the signal source is a 3-terminal element having one terminal set to a reference potential.

19. The differential amplifier circuit according to claim 2, wherein the signal source is a magnetoresistive element.

* * * * *